(12) United States Patent
Kosugi

(10) Patent No.: US 6,351,433 B1
(45) Date of Patent: *Feb. 26, 2002

(54) SEMICONDUCTOR MEMORY DEVICE EMPLOYING PIPELINE OPERATION WITH REDUCED POWER CONSUMPTION

(75) Inventor: Ryuichi Kosugi, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/549,344

(22) Filed: Apr. 13, 2000

(30) Foreign Application Priority Data

Oct. 15, 1999 (JP) .............................. 11-293734

(51) Int. Cl.⁷ .................................. G11C 8/00
(52) U.S. Cl. .............. 365/233; 365/230.01; 365/189.07
(58) Field of Search ............................. 365/233, 230.08, 365/240, 189.07, 189.12, 193, 230.01

(56) References Cited

U.S. PATENT DOCUMENTS 4,937,781 A * 6/1990 Lee et al. .................... 364/900
5,752,270 A   5/1998 Wada
5,838,631 A   11/1998 Mick
6,125,078 A * 9/2000 Ooishi et al. ................ 365/233

FOREIGN PATENT DOCUMENTS

JP   7-182870   7/1995
JP   9-270190   10/1997

* cited by examiner

Primary Examiner—David Nelms
Assistant Examiner—Thong Le
(74) Attorney, Agent, or Firm—McDermott, Will & Emery

(57) ABSTRACT

A synchronous semiconductor memory device according to the present invention includes a memory array circuit for performing reading/writing of data sent to or received at a data terminal with respect to a memory cell array; a write data retaining circuit and a write address retaining circuit for temporarily retaining write data and addresses corresponding to the write data, respectively; an address matching circuit for performing matching of an input address with addresses stored in the address retaining circuit; and a data path select circuit for outputting the write data temporarily stored in the write data retaining circuit to the data terminal according to the matching result. The address matching circuit is disabled during a clock cycle in which a writing operation is designated.

13 Claims, 9 Drawing Sheets

SEMICONDUCTOR MEMORY DEVICE EMPLOYING PIPELINE OPERATION WITH REDUCED POWER CONSUMPTION

BACKGROUND OF THE INVENTION

1. Field of the Invention

The present invention relates to semiconductor memory devices, and more particularly, to a synchronous semiconductor memory device employing a pipeline operation that consumes less power.

2. Description of the Background Art

A synchronous semiconductor memory device employing a pipeline operation is disclosed, for example, in U.S. Pat. No. 5,838,631, which prevents conflict of read data with write data at a data terminal to speed up the operation.

FIG. 7 is a block diagram illustrating a configuration of a conventional synchronous semiconductor memory device 5000 employing the pipeline operation, disclosed in the above-mentioned U.S. Pat. No. 5,838,631.

Referring to FIG. 7, semiconductor memory device 5000 includes: a terminal group 110 externally sending and receiving data, a clock signal and a control signal; a memory array circuit 120 for storing the externally sent and received data in a memory cell; a control circuit 130 for controlling reading/writing operations with memory array circuit 120 and data input/output at terminal group 110 according to the externally supplied control signal; and a write data retaining circuit 140 and a write address retaining circuit 150 for temporarily retaining, respectively, write data of which writing is designated and its corresponding address. Semiconductor memory device 5000 is able to temporarily retain two pieces of write data by write data retaining circuit 140 and write address retaining circuit 150. Accordingly, in semiconductor memory device 5000, sending and receiving of input/output data at a data terminal is performed 2 clock cycles later than the input of the corresponding address signal.

Data terminal group 110 receives a chip select signal CS# for driving a chip into a selected state, a clock enable signal CKE# for selecting an enabled/disabled state of the chip, a reference clock signal CLK, an address signal ADD consisting of address bits A0–An, and a write enable signal WE#. Data terminal group 110 includes a data terminal 19 performing data input/output.

An address register AReg.0 operates as an address buffer for taking in an address signal in response to each activation edge of reference clock signal CLK, and outputs an input address AR0 in each clock cycle.

Memory array circuit 120, having therein a plurality of memory cells arranged in rows and columns as storage elements, responds to a control signal output from control circuit 130 for reading data out of or writing data into a memory cell selected by an address signal. Although not shown, memory array circuit 120 includes memory cells arranged in rows and columns, a decoder for selecting a memory cell corresponding to an address signal, an input/output circuit for writing and reading data to and from a memory cell, and others. These features are collectively shown as memory array circuit 120 in FIG. 7. In other words, memory array circuit 120 responds to a control signal supplied from control circuit 130 to its signal terminals READ# and WRITE#, and performs a reading operation or a writing operation of data for the memory cell that corresponds to the address signal input to address terminal ADR. The write data for use in the writing operation are input from data terminal IN, and the read data being output from a memory cell by the reading operation are output from data terminal OUT.

When the chip is in an enabled state, i.e., when the clock enable signal is in an active state (at an L level), control circuit 130 responds to each activation edge of reference clock signal CLK and takes in the signal levels of control signals CS# and WE# at the relevant clock cycle, while retaining their signal levels of one clock cycle before.

In response to the combination of the signal levels, control circuit 130 generates control signals WB1, WB2, RB and the like, which are updated in response to each activation edge of reference clock signal CLK. Control signal WB1 is activated when the chip is in a selected state and the writing operation is designated by write enable signal WE# in the relevant clock cycle. Control signal RB is activated when the chip is in a selected state and the reading operation is designated by write enable signal WE# in the relevant clock cycle. Control signal WB2 is a signal which retains the signal level of control signal WB1 one clock cycle before, and it designates which should be performed at data terminal 19, data input or data output, at the next activation edge of reference clock signal CLK.

Write data retaining circuit 140 takes in and temporarily retains write data input to data terminal 19 by two register circuits DReg.1 and DReg.2 that are enabled in response to control signal WB2.

Write address retaining circuit 150 receives input address AR0 from address register AReg.0, and retains storage addresses AR1 and AR2 that correspond to the write data stored in write data retaining circuit 140 by two register circuits Areg.1 and Areg.2, that are enabled in response to the output of a logic gate 11 that outputs an OR logical operation result of control signal WB1 and clock enable signal CKE#.

An address matching circuit 160 includes address comparison circuits 30 and 32 which perform matching of input address AR0 with respective storage addresses AR1 and AR2 stored in address retaining circuit 150. Address comparison circuit 30 activates an address match signal EQ1 (to an H level) when input address AR0 matches storage address AR1. Address comparison circuit 32 activates an address match signal EQ2 (to an H level) when input address AR0 matches storage address AR2. If at least one of the two signals is activated, it means that an address corresponding to the write data that have been input from the data terminal but not yet written into memory array circuit 120 is now a target for the reading operation. In this case, there is a need to set a data path which permits the stored write data to be directly read out from the data terminal, instead of read data being directly output from the memory array circuit.

FIG. 8 is a block diagram illustrating configurations of address comparison circuits 30 and 32.

In FIG. 8, a configuration corresponding to each bit of address signal ADD is shown. Referring to FIG. 8, bits A0 to An of address signal ADD are supplied to address input terminals 4-0 to 4-n, respectively. Connected to each address input terminal are three address registers, which correspond to address registers AReg.0 to AReg.2 shown in FIG. 7. For example, address registers AReg.00, AReg.10 and AReg.20 are provided for address signal bit A0 input to address input terminal 4-0. As seen in FIG. 7, address register AReg.00 receives clock enable signal CKE# as its operation enable signal, and address registers AReg.10 and AReg.20 each receive the output of logic gate 11 as its operation enable signal. Each bit of the address signal is provided with a similar register circuit group. With such a configuration, signals AR00 to AR0n are obtained for respective bits corresponding to input address AR0 as shown in FIG. 7, and signals AR10 to AR1n and AR20 to AR2n are also obtained for respective bits corresponding to storage addresses AR1 and AR2.

Address comparison circuit 30 has address comparison units COMP10 to COMP1n. Address comparison unit COMP10 includes: a logic gate 52 that receives AR00 and AR10 to output their NAND logical operation result; a logic gate 53 that receives inverted signals of AR00 and AR10 to output their AND logical operation result; an inverter 54 that inverts an output of logic gate 53; and a logic gate 55 that receives inverted signals of respective outputs of logic gate 52 and inverter 54 to output their OR logical operation result. The output of logic gate 52 attains an L level when AR00 and AR10 are both at an H level and match with each other. Similarly, the output of logic gate 53 attains an H level when AR00 and AR10 are both at an L level and match with each other, and in response, the output of inverter 54 attains an L level.

Thus, when the signal levels of AR00 and AR10 match, one input of logic gate 55 attains an L level, and the output of logic gate 55 attains an H level. Each address comparison unit has a similar configuration. Address comparison unit COMP1i (i is an integer between 0 and n) detects a match of AR0i and AR1i.

Address comparison circuit 30 further includes: a logic gate 56 that receives an output of each address comparison unit; and an inverter 57 that inverts an output of logic gate 56. Logic gate 56 receives respective outputs of address comparison units COMP10 to COMP1n, and outputs their NAND logical operation result. Therefore, address match signal EQ1 attains an H level when every bit AR00–AR0n of the input address matches its corresponding bit AR10–AR1n of storage address AR1.

Address comparison circuit 32, though detailed configuration of which is not shown, has a configuration similar to that of address comparison circuit 30. Address comparison circuit 32 compares respective bits AR00 to AR0n of input address AR0 with corresponding bits AR20 to AR2n of storage address AR2 and, when all the bit pairs match completely, activates an address match signal EQ2 (to an H level).

Returning to FIG. 7, a data path select circuit 170 includes data path setting circuits 171 to 174, which form data paths for directly reading out write data stored in write data retaining circuit 140 or write data input at the data terminal at a relevant clock cycle, dependent on the comparison result of address matching circuit 160. Data path setting circuits 171 to 174 set paths 1 to 4, respectively, according to the combination of the comparison result of address matching circuit 160 and control signal WB2.

Read data selected by data path select circuit 170 are supplied to the D terminal of a read data register DReg.3. Read data register DReg.3 is enabled, in response to control signal RB, at a clock cycle in which the chip is in a selected state and a reading operation is designated. It then outputs data that have been input to its D terminal from data path select circuit 170 to its Q terminal in response to an activation edge of reference clock signal CLK. When an output enable signal OE# is in an active state, the data that were output to Q terminal are output via a buffer circuit 28, which is controlled according to the combination of control signals CS2 and WB2. The data are then output from data terminal 19 in response to an activation edge of reference clock signal CLK at a clock cycle in which a data output is designated to the data terminal, i.e., at a clock cycle that is two clock cycles after the clock cycle in which the reading operation was designated.

With the configuration as described above, semiconductor memory device 5000 provides its data input system with a latching capability, so that write data are temporarily retained before being written into the memory array circuit. Thus, the reading/writing operations for the memory cell array and the data input/output operations at the data terminal can be performed independent of each other, whereby high-speed data transfer is accomplished based on the pipeline system.

FIG. 9 is a timing chart illustrating the operation of the conventional semiconductor memory device 5000. In FIG. 9, clock enable signal CKE#, chip select signal CS# and output enable signal OE# are all assumed to be in an active state (at an L level) to illustrate a normal operation mode. FIG. 9 includes all the possible combinations of reading/writing operations within four clock cycles. Write enable signal WE# designates, at each cycle time from cycle time t1 through cycle time t19, a series of operations of W (write operation) WWWR (read operation) RRRWWRWRRWR-WWW.

Referring to FIG. 9, clock cycles t1 to t21 are defined in response to respective activation edges of reference clock signal CLK. Address signal ADD is input at an activation edge of clock signal CLK in each clock cycle. Write enable signal WE# is set at an L level in a clock cycle in which a writing operation is designated, and set at an H level in a clock cycle in which a reading operation is designated.

Read data or write data corresponding to the input address are output from or input to data terminal 19 two clock cycles later. For example, input data D1 to D4 corresponding to input addresses A1 to A4 in clock cycles t1 to t4 in each of which the writing operation is designated are input to the data terminal two clock cycles later, i.e., in clock cycles t3 to t6. Read data D (A5) to D (A8) corresponding to input addresses A5 to A8 in clock cycles t5 to t8 in each of which the reading operation is designated are output from the data terminal two clock cycles later in clock cycles t7 to t10.

Address register AReg.0 takes in an address signal received at the address input terminal 4 at each clock cycle as input address AR0. Address registers AReg.1 and AReg.2 sequentially take in and transfer the input addresses in response to activation of control signal WB1 (to an L level), so that storage addresses AR1 and AR2 change correspondingly. Storage data WD1 and WD2 change as they are updated by data registers DReg.1 and DReg.2 that operate in response to activation of control signal WB2 (to an L level).

Read data register DReg.3 stores read data which correspond to the input address being input as a target of the reading operation and are selected by data path select circuit 170.

For memory array circuit 120, either the reading operation or the writing operation is performed depending on the signal level of write enable signal WE# in the relevant clock cycle. The memory cell targeted for the writing operation is the one that corresponds to the address signal that was input two clock cycles before.

In address matching circuit 160, the above-described address comparison circuits 30 and 32 perform matching of input address AR0 with storage addresses AR1 and AR2, respectively, in each clock cycle. Normally, at a cycle in which a reading operation is designated, data output from a memory cell corresponding to input address AR0 are transmitted to read data register DReg.3 via path 1, and are output from data terminal 19 as output data.

However, if address matching circuit 160 detects that at least one of storage addresses AR1 and AR2 matches input address AR0, i.e., when at least one of address match signals EQ1 and EQ2 is activated (to an H level), any one of paths 2 to 4 is established instead of path 1. In this case, transmitted to read data register DReg.3 as a target of the reading operation is not the read data from the memory array circuit, but storage data WD1, WD2, or the write data input to the data terminal at the relevant clock cycle.

As explained above, conventional semiconductor memory device 5000 employs a pipeline operation to perform the reading/writing operations for the memory cell array and the data input/output operations at the data terminal independent of each other. However, it is necessary to constantly check the correlation between the address corresponding to storage data that have temporarily been stored at the data retaining circuit but have not yet been written into the memory array circuit, and the address for which reading is newly designated. Thus, conventional semiconductor memory device 5000 is provided with address matching circuit 160.

This address matching circuit 160 of conventional semiconductor memory device 5000 is constantly held in an enabled state to perform matching between the input address and the storage address, regardless of which operation, reading or writing, is designated by the semiconductor memory device. This results in unnecessary power consumption.

In this conventional semiconductor memory device 5000, it is possible to omit an unnecessary writing operation to the memory array circuit in the case where a reading operation is to be performed immediately after the writing operation for the same address, for faster operation and reduced power consumption. However, in the case where writing operations are continuously designated for the same address, the device cannot omit a writing operation of the preceding data that is obviously unnecessary because the data will be overwritten immediately after the operation. This also causes unnecessary power consumption.

SUMMARY OF THE INVENTION

The present invention is directed to solve the above-described problems. An object of the present invention is to provide a synchronous semiconductor memory device employing a pipeline operation that consumes less power.

In summary, the present invention is a synchronous semiconductor memory device performing data input/output according to a control signal and an address signal, comprising a plurality of address terminals, a data terminal, a memory array circuit, a control circuit, a data retaining circuit, an address retaining circuit, an address select circuit, an address comparison circuit, and a read data select circuit.

The plurality of address terminals receive respective bits of an address signal. The data terminal inputs/outputs data. The memory array circuit performs reading of data from and writing of data to a plurality of memory cells arranged in rows and columns according to the address signal. The control circuit designates either a reading operation or a writing operation to the memory array circuit and also designates either data input or data output at the data terminal, according to the control signal at each clock cycle. The data retaining circuit, provided between the data terminal and the memory array circuit, takes in write data input to the data terminal at a clock cycle in which the data input is designated, and temporarily retains at least one piece of write data as storage data until it is written into the memory cell. The address retaining circuit receives the address signal from the plurality of address terminals, and retains at least one storage address signal corresponding to at least one piece of storage data. The address select circuit receives a read address signal being an address signal input to the address terminals for data output and a storage address signal, and selectively transmits one of the address signals to the memory array circuit, in response to the operation designated to the memory array circuit. The address comparison circuit performs matching between the read address signal and each storage address signal at a clock cycle in which the reading operation is designated. The read data select circuit responds to the matching result of the address comparison circuit, and selects one data from the write data, the storage data and the read data from the memory array circuit that corresponds to the read address signal. The read data latch circuit latches the data selected by the read data select circuit, and transmits the data to the data terminal at a clock cycle in which data output is designated.

According to another aspect of the present invention, a synchronous semiconductor memory device performing data input/output according to a control signal and an address signal comprises a plurality of address terminals, a data terminal, a memory array circuit, a control circuit, a data retaining circuit, an address retaining circuit, an address select circuit, an address comparison circuit, and a read data select circuit.

The plurality of address terminals receive respective bits of an address signal. The data terminal inputs/outputs data. The memory array circuit performs reading of data from and writing of data to a plurality of memory cells arranged in rows and columns, according to the address signal. The control circuit designates either a reading operation or a writing operation to the memory array circuit and also designates either data input or data output at the data terminal, according to the control signal at each clock cycle. The data retaining circuit, provided between the data terminal and the memory array circuit, takes in write data input to the data terminal at a clock cycle in which data input is designated, and temporarily retains at least one piece of write data as storage data until it is written into the memory cell. The address retaining circuit receives the address signal from the plurality of address terminals, and retains at least one storage address signal corresponding to at least one piece of storage data. The address select circuit receives a read address signal being an address signal input to the address terminals for data output and a storage address signal, and selectively transmits one of the address signals to the memory array circuit in response to the operation designated to the memory array circuit. The address comparison circuit performs matching of the storage address signals with the read address signal and a write address signal being an address signal input to the address terminals for data writing. In the case where the write address signal matches one of the storage address signals, the address comparison circuit cancels the writing operation of the storage data corresponding to the matched storage address signal to the memory array circuit. The read data select circuit responds to the matching result of the address comparison circuit, and selects one data from the write data, the storage data and the read data from the memory array circuit corresponding to the read address signal. The read data latch circuit latches the data selected by the read data select circuit, and transmits the data to the data terminal at a clock cycle in which data output is designated.

Therefore, a primary advantage of the present invention is that it is possible to provide a synchronous semiconductor memory device employing a pipeline operation that accomplishes high-speed data transfer with reduced power consumption, by allowing its address comparison circuit to operate only at the clock cycle in which a reading operation is designated, to determine if the reading operation is performed for the address retained in the address retaining circuit.

Another advantage of the present invention is that it is possible to provide a synchronous semiconductor memory device employing a pipeline operation that accomplishes high-speed data transfer with further reduced power consumption, by canceling, when the address retained in the address retaining circuit has become a target of another writing operation, the no longer necessary writing operation of the old write data to the memory array circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
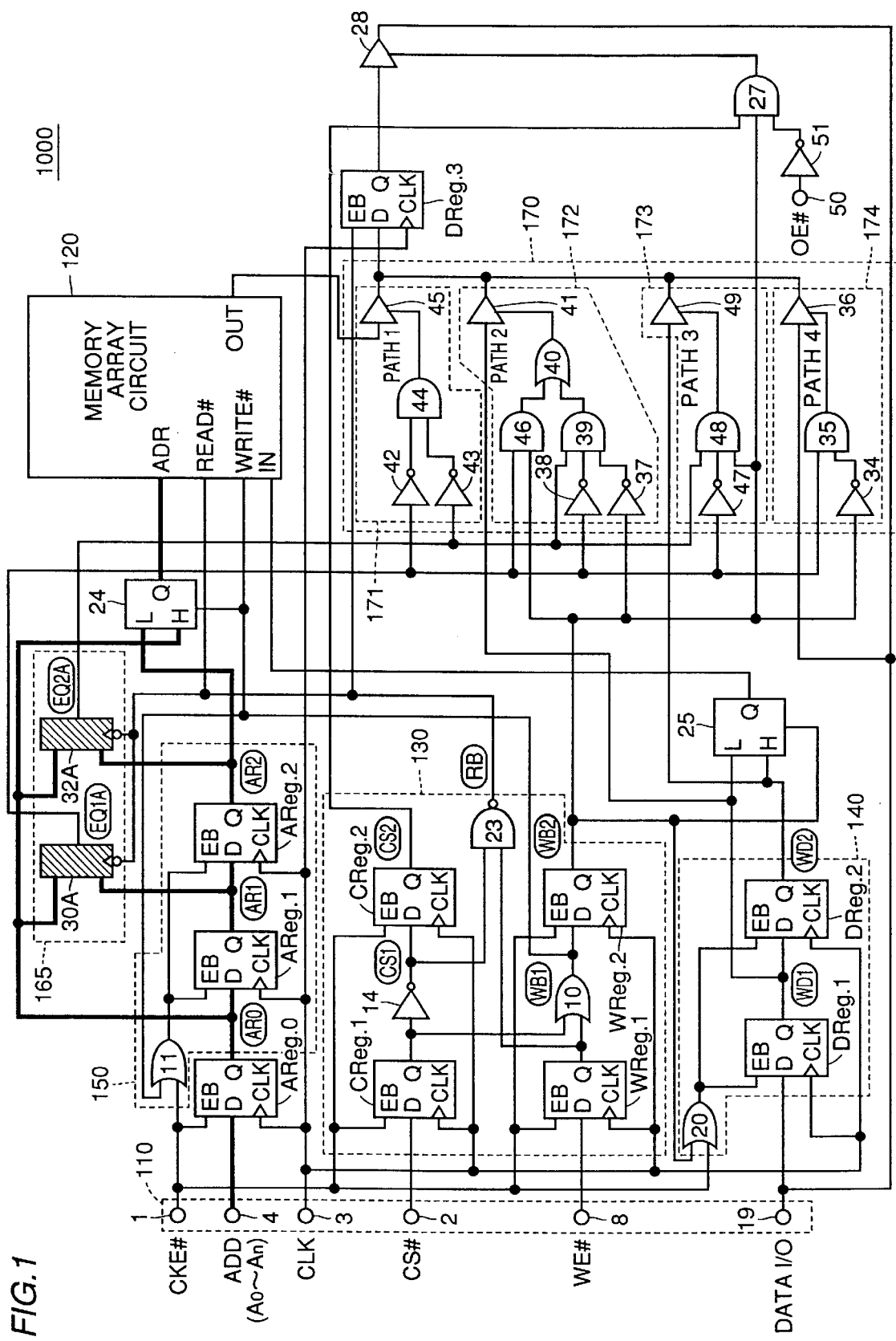
FIG. 1 is a block diagram showing a configuration of a synchronous semiconductor memory device 1000 according to a first embodiment of the present invention.

Hereinafter, embodiments of the present invention will be described in detail with reference to the drawings. The same reference characters in the drawings denote the same or corresponding portions.

First Embodiment

Referring to FIG. 1, a semiconductor memory device 1000 according to the first embodiment, similar to semiconductor memory device 5000, includes: a terminal group 110 externally sending and receiving data and a control signal; a memory array circuit 120 for storing the externally sent and received data in a memory cell; a control circuit 130 for controlling reading/writing operations for memory array circuit 120 and data input/output at terminal group 110 according to the externally supplied control signal; and a write data retaining circuit 140 and a write address retaining circuit 150 for temporarily retaining write data of which writing is designated and its corresponding address, respectively.

Semiconductor memory device 1000 can temporarily retain two pieces of write data, like semiconductor memory device 5000, so that sending and receiving of input/output data at the data terminal are performed two clock cycles later than the input of the corresponding address signal. In this embodiment, the number of pieces of retainable write data has been set to 2 by way of example, and correspondingly, the timing difference between the address input and the data input/output is two clock cycles. However, the timing difference may be set to any k number of clock cycles (k is a natural number) by adjusting the number of stages of register circuits provided in control circuit 130, write data retaining circuit 140 and write address retaining circuit 150.

Terminal group 110 includes: a clock enable terminal 1 receiving clock enable signal CKE# for selecting an enabled/disabled state of a chip; a chip select terminal 2 receiving chip select signal CS# for driving the chip to a selected state; a clock terminal 3 receiving reference clock signal CLK; an address input terminal 4 receiving address signal ADD; a write enable terminal 8 receiving write enable signal WE#; a data terminal 19 for input/output of data; and an output enable terminal 50 receiving output enable signal OE#.

Semiconductor memory device 1000 operates according to the combination of these externally supplied control signals. Chip select signal CS# and clock enable signal CKE# are activated (to an L level) in a normal operation mode. Output enable signal OE# is a control signal that enables/disables a data reading operation from semiconductor memory device 1000, and is activated (to an L level) in the normal operation mode. Address signal ADD is a signal for designating one of the memory cells arranged in rows and columns within memory array circuit 120 to be a target for the reading/writing operation. Though the address signal is expressed as one signal in general in FIG. 1, it actually is a signal of (n+1) bits expressed by address bits A0 to An (n is a natural number). Address input terminal 4 receives the signal of each bit.

Write enable signal WE# is a signal for designating either a reading operation or a writing operation to semiconductor memory device 1000 in the relevant clock cycle. When control signal WE# is at an L level, the writing operation is designated. When control signal WE# is at an H level, the reading operation is designated.

The address signal input to address input terminal 4 is sent to address register AReg.0. Address register AReg.0 receives clock enable signal CKE# as its operation enable signal, takes in address signal ADD input to the address input terminal corresponding to the activation edge of reference clock signal CLK at each clock cycle, and outputs the signal from its Q terminal as input address AR0.

In other words, input address AR0 is an address signal that is input to address terminal 4 in the relevant clock cycle, and address register AReg.0 serves as an address buffer.

Figure 7:
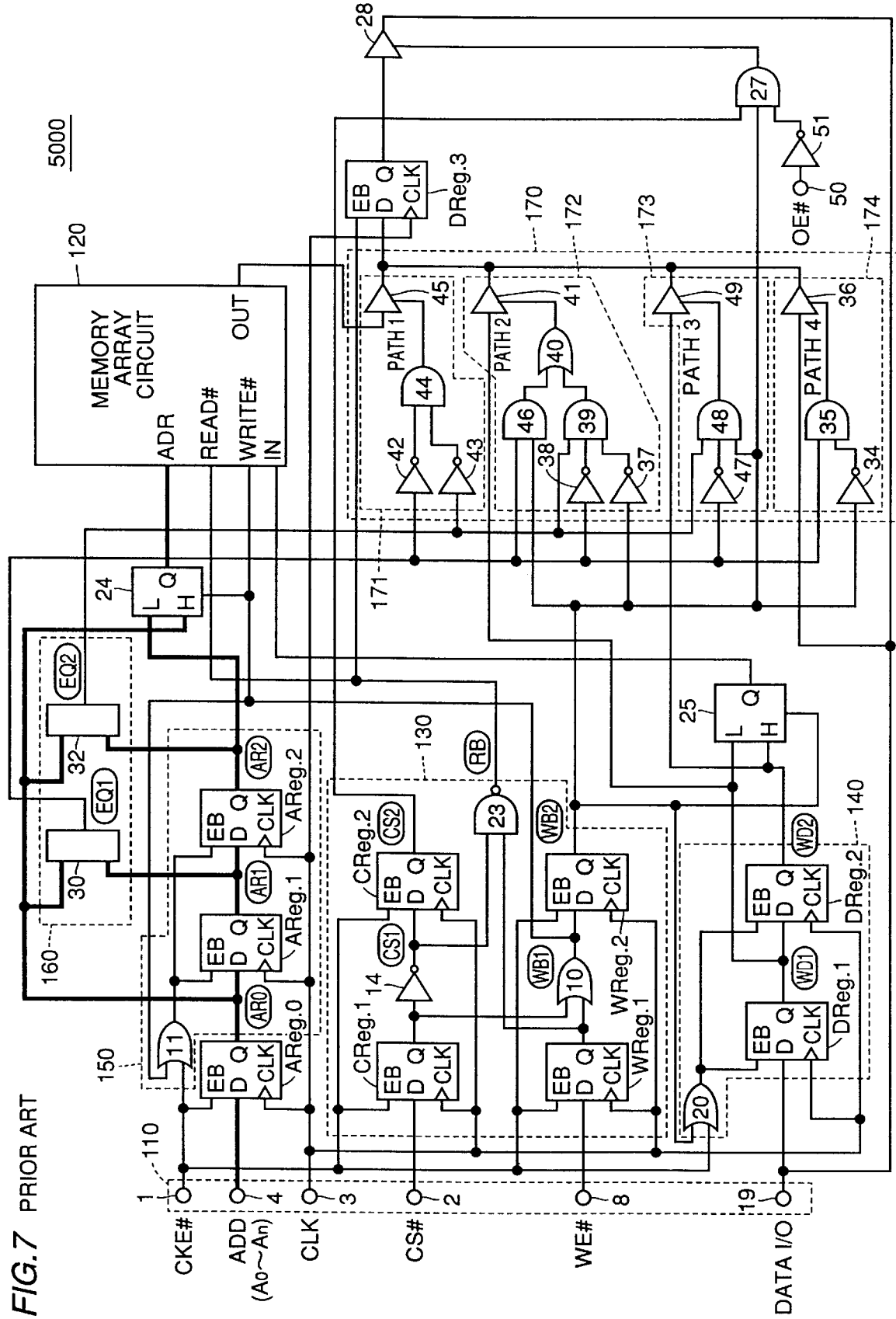
FIG. 7 is a block diagram showing a configuration of a conventional synchronous semiconductor memory device 5000.
Figure 8:
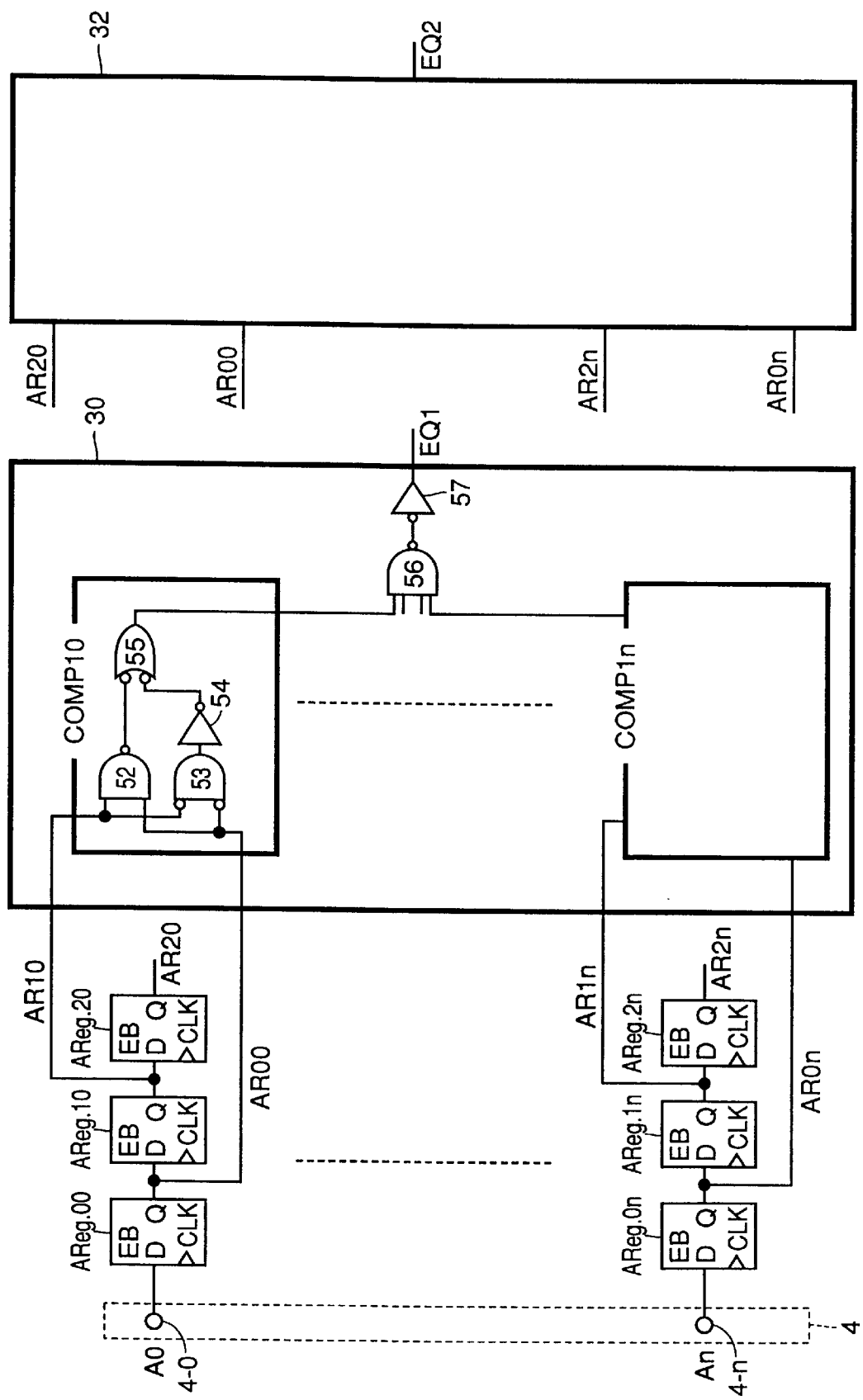
FIG. 8 is a block diagram showing configurations of address comparison circuits 30 and 32.

Memory array circuit 120 has a configuration as shown in FIG. 7, and description of which is not repeated.

Control circuit 130 includes: a chip select register CReg.1 receiving chip select signal CS# from chip select terminal 2; an inverter 14 inverting an output of chip select register CReg.1 to output control signal CS1; a chip select register CReg.2 receiving control signal CS1 to output control signal CS2; a write enable register WReg.1 receiving write enable signal WE#; a logic gate 10 receiving outputs of write enable register WReg.1 and chip select register CReg.1 to output their OR logical operation result as control signal WB1; a write enable register WReg.2 outputting a control signal WB2 that is control signal WB1 delayed by one clock cycle; and a logic gate 23 receiving control signal CS1 and the output of write enable register WReg.1 to output their NAND logical operation result as control signal RB.

Each of chip select registers CReg.1, CReg.2 and write enable registers WReg.1, WReg.2 receives clock enable signal CKE# as its operation enable signal, and outputs the data input from its D terminal to its Q terminal in response to the activation edge of reference clock signal CLK; otherwise, it retains the output of Q terminal.

Control circuit 130 outputs control signals CS1, CS2, WB1, WB2 and RB. Control signal CS1 is an inverted signal of chip select signal CS# at the relevant clock cycle. Control signal CS2 shows a signal level of control signal CS1 one clock cycle before.

Control signal WB1 is defined by the combination of chip select signal CS# and write enable signal WE# at the relevant cycle. It is activated (to an L level) when chip select signal CS# is activated (to an L level) and a writing operation is designated by the write enable signal (at an L level); otherwise, it is inactivated (to an H level). In other words, control signal WB1 is activated when the chip is in a selected state and the writing operation is designated by the write enable signal at the relevant clock cycle.

Control signal WB2 shows a signal level of control signal WB1 one clock cycle before. At an activation timing of reference clock signal CLK in a forthcoming clock cycle, control signal WB2 has the signal level corresponding to the operation, reading or writing, that was designated two cycles before the forthcoming clock cycle. This means that control signal WB2 shows which is to be performed at data terminal 19, the data input or the data output, at the activation timing of reference clock signal CLK of the forthcoming clock cycle. Therefore, at the clock cycle in which control signal WB2 is at the L level at the activation edge of reference clock signal CLK, the write data are input to data terminal 19, whereas the read data are output from data terminal 19 at the clock cycle in which control signal WB2 is at the H level.

Control signal RB is determined according to the signal levels of control signal CS1 and write enable signal WE# at the relevant clock cycle. It is activated (to an L level) when chip select signal CS# is activated (to an L level) and the reading operation is designated by the write enable signal (at the H level) at the relevant clock cycle; otherwise, it is inactivated (at the H level). That is, control signal RB is activated when the chip is in a selected state and the reading operation is designated by the write enable signal at the relevant clock cycle.

Thus, control signals WB1 and RB are both inactivated (to an H level) at a cycle in which chip select signal CS# is inactivated (to the H level). Conversely, at a clock cycle in which chip select signal CS# is activated (to the L level), control signal RB or WB1 is activated, complementarily to each other, in response to the signal level of write enable signal WE#.

Control signal RB is supplied to a READS terminal of memory array circuit 120, and, when activated, designates a data reading operation to the memory array circuit. Control signal WB1 is supplied to a WRITE# terminal of memory array circuit 120 and, when activated, designates a data writing operation to memory array circuit 120.

Write data retaining circuit 140 includes: a logic gate 20 receiving clock enable signal CKE# and control signal WB2 to output their OR logical operation result; and two data registers DReg.1 and DReg.2.

Data registers DReg.1 and DReg.2 each receive the output signal of logic gate 20 as its operation enable signal. When chip select signal CS# is in an active state, data register DReg.1 takes in, at the clock cycle in which write data are input to data terminal 19, the write data from its D terminal in response to the activation edge of reference clock signal CLK and outputs the data from its Q terminal as storage data signal WD 1. Similarly, data register DReg.2 takes in, at the clock cycle in which write data are input to data terminal 19, storage data signal WD1 input to its D terminal in response to the activation edge of reference clock signal CLK and outputs the data from its Q terminal as storage data signal WD2.

Storage data signals WD1 and WD2 are transmitted via a data multiplexer 25 to memory array circuit 120. Thus, in semiconductor memory device 1000, the write data are stored in the write data retaining circuit before being written into memory array circuit 120.

Write address retaining circuit 150 includes: a logic gate 11 receiving clock enable signal CKE# and control signal WB1 to output their OR logical operation result; and two address registers AReg.1 and AReg.2 each receiving the output of logic gate 11 as its operation enable signal.

When the output of logic gate 11 is at an L level, i.e., at a clock cycle in which the chip is selected and enabled and the writing operation is designated by write enable signal WE#, address register AReg.1 takes in input address signal AR0 in response to the activation edge of reference clock signal CLK, and transfers the signal as storage address signal AR1.

Address register AReg.2, operating at a timing similar to that of address register AReg.1, receives storage address signal AR1 at its D terminal and transfers it as storage address signal AR2. In other words, write address retaining circuit 151) serves to retain address signals AR1 and AR2 that correspond to storage data WD1 and WD2, respectively, retained in write data retaining circuit 140.

Semiconductor memory device 1000 further includes an address matching circuit 165 that performs matching of input address AR0 input at the relevant cycle with storage addresses AR1 and AR2 retained in write address retaining circuit 150.

Semiconductor memory device 1000 according to the present embodiment differs from the conventional semiconductor memory device 5000 in that it is provided with address matching circuit 165 instead of address matching circuit 160. Address matching circuit 165 includes address comparison circuits 30A and 32A instead of address comparison circuits 30 and 32 of address matching circuit 160. Address comparison circuit 30A, like address comparison circuit 30, performs matching of input address AR0 and storage address AR1. Address comparison circuit 32A, like address comparison circuit 32, performs matching of input address AR0 and storage address AR2.

Address comparison circuits 30A and 32A are different from address comparison circuits 30 and 32 in that they each receive control signal RB as its operation enable signal. As described above, control signal RB is a signal that is activated (to an L level) when the chip is selected (chip select signal CS#=L level) and a reading operation is designated (write enable signal WE#=H level) at the relevant clock cycle. Therefore, address comparison circuits 30A and 32A will not operate even when the chip is selected unless the reading operation is designated at the clock cycle.

Specifically, at the clock cycle in which a writing operation is designated, the memory array circuit does not output read data, and thus, there is no need to set a data path therefor. Thus, in such a clock cycle, address comparison circuits 30A and 32A stop their address comparing operations. With such a configuration, it is possible to significantly reduce power consumption of the address comparison circuits, compared with the case of the conventional semiconductor memory device 5000 in which the address comparison circuits performed the address matching operations at every clock cycle regardless of which operation, reading or writing, was designated therein.

The configurations of address comparison circuits 30A and 32A will now be described in more detail with reference to FIG. 2.

Figure 2:
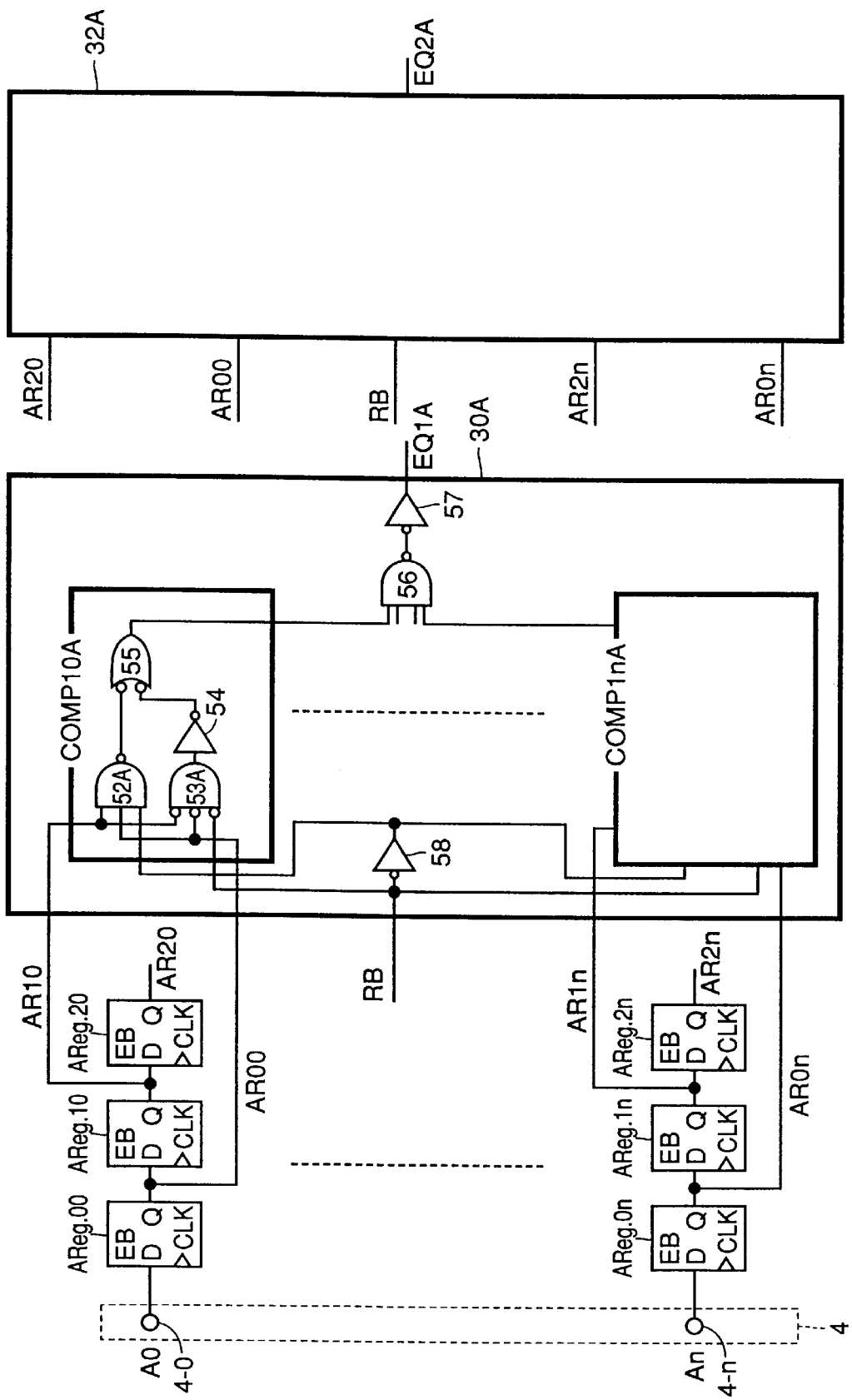
FIG. 2 is a block diagram showing configurations of address comparison circuits 30A and 32A.

Referring to FIG. 2, bits A0 to An of the address signal are input into respective address input terminals 4-0 to 4-$n$. Corresponding to respective bits A0 to An, AR00 to AR0$n$ corresponding to respective bits of input address AR0, AR10 to AR1$n$ corresponding to respective bits of storage address AR1, and AR20 to AR2$n$ corresponding to respective bits of storage address AR2 are output from respective address registers.

Address comparison circuit 30A has address comparison units COMP10A to COMP1$n$A. Address comparison unit COMP10A includes: a logic gate 52A receiving the leading bit AR00 of the input address, the leading bit AR10 of storage address AR1 and control signal RB as its three inputs to output their NAND logical operation result; a logic gate 53A receiving inverted signals of respective inputs to logic gate 52A to output their AND logical operation result; an inverter 54 inverting an output of logic gate 53A; and a logic gate 55 receiving an inverted signal of an output of inverter 54 and an inverted signal of an output of logic gate 52A to output their OR logical operation result.

Logic gate 52A outputs a signal at an L level in the case where AR00 and AR10 both at an H level match with each other when control signal RB is at the L level, i.e. when the chip is in a selected state and a reading operation is designated. Similarly, logic gate 53A outputs a signal at an H level when bit signals AR00 and AR10 both at an L level match with each other while the chip is in the selected state and the reading operation is designated, and in response, the output of inverter 54 attains an L level. Therefore, logic gate 55 outputs a signal at an H level when AR00 and AR10 match with each other either at the H level or at the L level.

An address comparison unit with the similar configuration is provided for each bit of the address signal. If the i-th address comparison unit is expressed as COMP1$i$A (i is an integer between 0 and n), address comparison unit COMP1$i$A compares the i-th bit of the input address and the i-th bit of storage address AR1 and, when they match, outputs a signal at the H level.

Address comparison circuit 30A further includes: a logic gate 56 receiving each output of address comparison unit COMP10A to COMP1$n$A to output their NAND logical operation result; and an inverter 57 for inverting an output of logic gate 56 to output address match signal EQ1A.1. The output of logic gate 56 attains an L level only when all the bits of input address AR0 match corresponding bits of storage address AR1 completely, and in response, address match signal EQ1A is activated (to an H level).

Although not shown in detail, address comparison circuit 32A has a configuration similar to that of address comparison circuit 30A. It performs matching of AR00 to AR0$n$ corresponding to respective bits of input address AR0 with AR20 to AR2$n$ corresponding to respective bits of storage address AR2, and activates address match signal EQ2A (to an H level) when all the bit pairs match completely.

In semiconductor memory device 1000 with such a configuration, the address comparison circuits do not operate when the device is in a non-selected state; or, even if the device is in a selected state, they do not operate at a clock cycle in which a writing operation is designated. Therefore, it is possible to reduce the power consumption by avoiding unnecessary address comparing operations.

Returning to FIG. 1, semiconductor memory device 1000, like conventional semiconductor memory device 5000, includes: a data path select circuit 170 for setting a data path of read data according to the comparison results EQ1A and EQ2A of address matching circuit 165; a read data register DReg.3 receiving an output of data path select circuit 170 to output read data to data terminal 19; an address multiplexer 24; and a data multiplexer 25.

Address multiplexer 24, in response to the signal level of control signal WB1, outputs either input address AR0 or storage address AR2 to an address input terminal ADR of the memory array circuit. At the clock cycle in which a writing operation is designated, storage address AR2 within the write address retaining circuit is supplied to the memory array circuit such that the storage data stored in the write data retaining circuit are written into the memory array circuit. At the clock cycle in which a reading operation is designated, input address AR0 is transmitted directly to the memory array circuit.

Data multiplexer 25, in response to the signal level of control signal WB2, outputs either storage data WD1 or WD2 to an IN terminal of the memory array circuit. With such a configuration, either storage data WD1 or WD2, which correspond to address signal AR1 or AR2 being sequentially sent and updated at each operation cycle in which a writing operation is designated, are written into memory array circuit 120.

Data path select circuit 170 sets a data path for reading out the write data being stored directly from the data terminal, in the case where at least one of storage addresses AR1 and AR2 matches input address AR0, i.e., in the case where an address corresponding to the write data which have been input from the data terminal but not yet written into memory array circuit 120 is now a target of the reading operation.

Data path select circuit 170 includes data path setting circuits 171 to 174. Data path setting circuits 171 to 174 set paths 1 to 4, respectively, according to the combinations of address match signals EQ1A, EQ2A and control signal WB2.

Path 1 is a path used when input address AR0 does not match either storage address AR1 or AR2, for transmitting the read data from memory array circuit 120 to read data register DReg.3 for output from data terminal 19.

Path 2 is a data path for transmitting storage data WD1 to read data register DReg.3 in the case where input address AR0 matches storage address AR1 and write data are not input at the relevant clock cycle, and in the case where input address AR0 matches storage address AR2 and write data are input at the relevant clock cycle.

Path 3 is a data path for transmitting storage data WD2 to read data register DReg.3 in the case where input address AR0 matches storage address AR2 and write data are not input at the relevant clock cycle.

Path 4 is a data path for transmitting the data having been input to data terminal 19 to read data register DReg.3 to make the data directly become a target for the reading operation, in the case where input address AR0 matches input address AR1 one clock cycle before and write data are input in the relevant clock cycle.

Further, in the case where input address AR0 matches both storage addresses AR1 and AR2, a data path that is the same as in the case where input address AR0 matches storage address AR1 corresponding to the input address one clock cycle before is set so that the latest input data are reflected.

The read data selected by data path select circuit 170 are supplied to the D terminal of read data register DReg.3. The operation of read data register DReg.3 and the data output operation to the data terminal via buffer circuit 28 are as described above in conjunction with FIG. 7, and therefore, description thereof is not repeated here.

Figure 3:
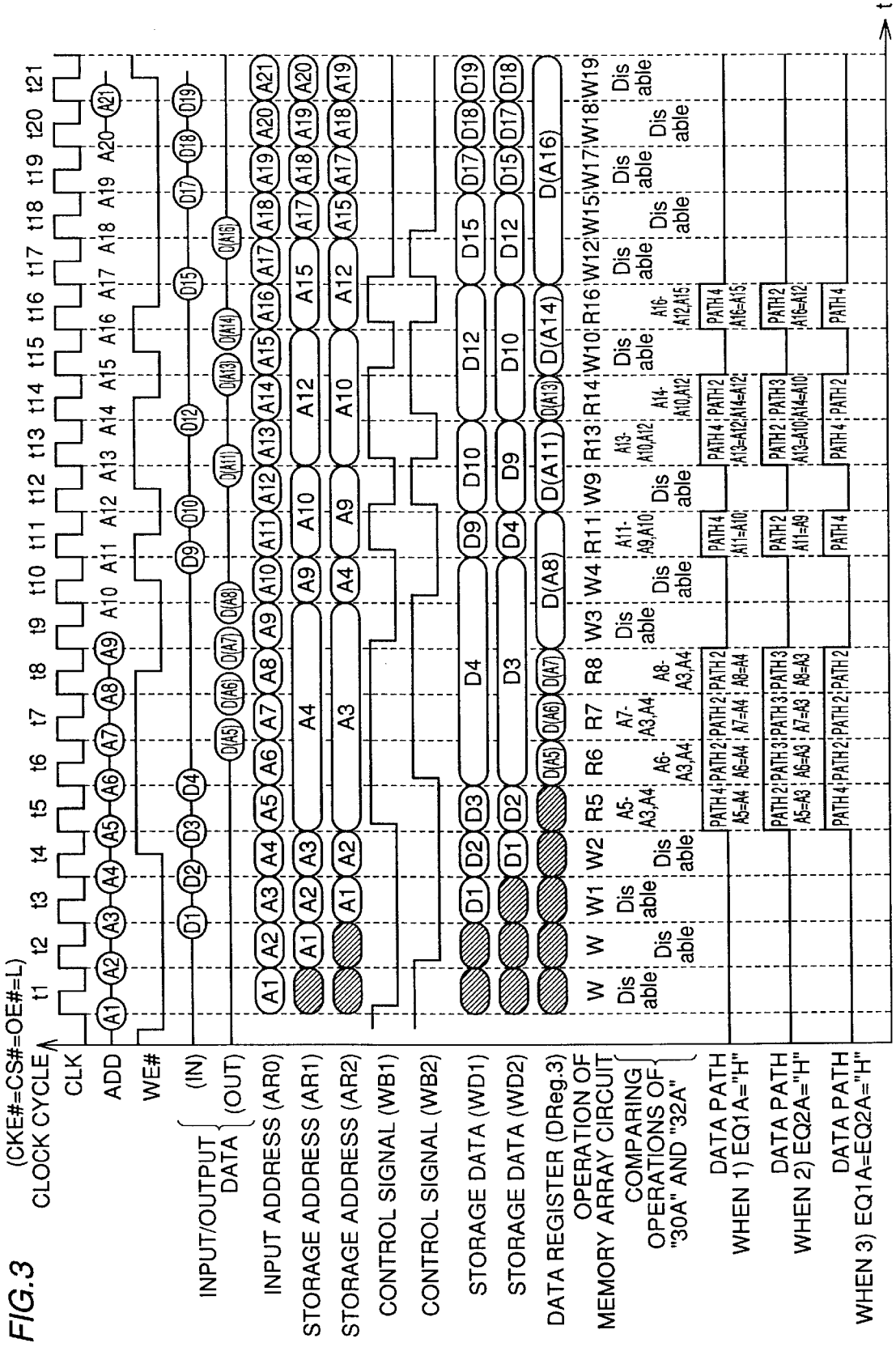
FIG. 3 is a timing chart illustrating the operation of synchronous semiconductor memory device 1000 according to the first embodiment.

The operation of semiconductor memory device 1000 will now be described with reference to the timing chart of FIG. 3. In FIG. 3, as in FIG. 9, clock enable signal CKE#, chip select signal CS# and output enable signal OE# are all assumed to be in an active state (at an L level) to illustrate the normal operation mode.

Figure 9:
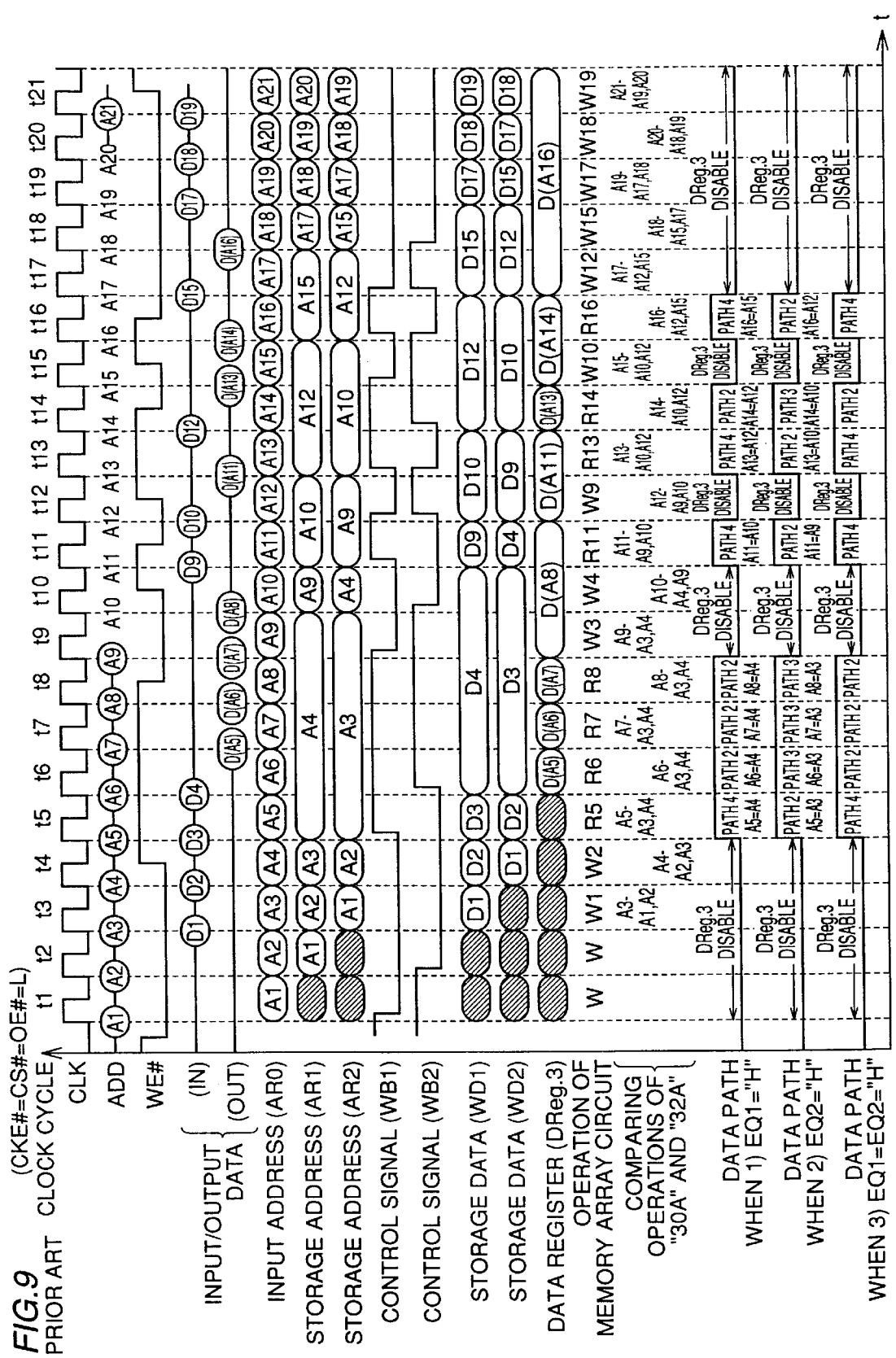
FIG. 9 is a timing chart illustrating the operation of synchronous semiconductor memory device 5000.

FIG. 3 includes all the possible combinations of reading and writing operations within four clock cycles, as in the case of FIG. 9. Write enable signal WE# makes transitions in the same pattern as in FIG. 9, and thus, designates the same series of operations of W (writing operation) WWWR (reading operation) RRRWWRWRRWRWWW at respective clock cycles from t1 to t19.

Further, addresses A1 to A21 are input at respective clock cycles, as in the case of FIG. 9.

Through clock cycles t1 to t21, clock enable signal CKE# is in an active state (at the L level). Thus, address register AReg.0, chip select registers CReg.1, CReg.2 and write enable registers WReg.1, WReg.2 are all enabled, and transfer data in response to the respective activation timings of reference clock signal CLK.

Firstly, in clock cycle t1, address A1 supplied to the address input terminal is taken in by address register AReg.0 in synchronization with the activation edge of reference clock signal CLK, and appears as input address AR0. Write enable signal WE# is taken in by write enable register WReg.1. Control signal WB1 being an output of logic gate 10 receiving the outputs of write enable register WReg.1 and chip select register CReg.1 as its two inputs, is set to an L level.

Next, in clock cycle t2, address signal A2 is taken in by address register AReg.0, and appears as input address AR0. In this cycle, write enable signal WE# is also at the L level, and thus, control signal WB1 is set at the L level. In response, address registers AReg.1 and AReg.2 are enabled. Address A1 stored in address register AReg.0 in clock cycle t1 is taken in to address register AReg.1, and appears as storage address AR1. In this clock cycle, write enable register WReg.2 takes in the signal level of control signal WB1 at clock cycle t1, and alters the signal level of control signal WB2 from the H level to the L level.

Next, in clock cycle 3, address signal A3 is taken in by address register AReg.0 and appears as input address AR0.

At the activation timing of reference clock signal CLK in clock cycle t3, control signals WB1 and WB2 are both at the L level. Therefore, address registers AReg.1, AReg.2 and data registers DReg.1, DReg.2 are all enabled. In response, addresses A2 and A1 stored in address registers AReg.0 and AReg.1 in the previous clock cycle t2 emerge as storage addresses AR1 and AR2, respectively. Further, data D1 corresponding to address A1 for which writing was designated in clock cycle t1 are input to data terminal 19, taken into data register DReg.1, and appear as storage data WD1.

Write enable signal WE# is still at the L level in clock cycle t3. Thus, control signal WB1 is set at the L level. Write enable register WReg.2 sets control signal WB2 to the L level that is equal to the signal level of WB1 at the previous clock cycle t2.

An access to memory array circuit 120 in clock cycle t3 is performed as follows. In this clock cycle, control signal WB1 is at the L level, and complementarily set control signal RB is at the H level. Thus, a writing operation is set for memory array circuit 120. In response to control signal WB1 at the L level, address multiplexer 24 outputs address AR2 (A1) at its L side. As control signal WB2 is also at the L level, data multiplexer 25 outputs storage data WD1 (D1) at its L side. Therefore, in clock cycle t3, data D1 are written into memory array circuit 120, to a memory cell corresponding to address A1. Further, read data register DReg.3 is disabled because control signal RB is at the H level and the reading operation is not performed. The output of logic gate 27 is at the L level because control signal WB2 is at the L level, and thus, buffer circuit 28 outputs no read data.

Next, in clock cycle t4, address signal A4 is taken in by address register AReg.0, and appears as input address AR0.

At the activation timing of reference clock signal CLK in clock cycle t4, control signals WB1 and WB2 are both at the L level, and therefore, address registers AReg.1, AReg.2 and data registers DReg.1, DReg.2 are all enabled. In response, storage addresses AR1 and AR2 are updated to addresses A3 and A2, respectively. Further, data D2 corresponding to address A2 for which writing was designated at clock cycle t2 are input into data terminal 19. The data in data terminal 19 and in data register DReg.1 are taken in by succeeding data registers DReg.1 and DReg.2, respectively, and thus, storage data WD1 and WD2 are updated to respective data D2 and D1.

Write enable signal WE# is still at the L level in clock cycle t4. Thus, control signal WB1 is set at the L level, and control signal WB2 is set at the L level by write enable register WReg.2, which is the same level as that of WB1 at the previous clock cycle t3.

The access to memory array circuit 120 in clock cycle t4 is performed as follows. In this clock cycle, control signal WB1 is at the L level, and complementarily set control signed RB is at the H level. Thus, a writing operation is set for memory array circuit 120. In response to control signal WB1 at the L level, multiplexer 24 outputs address AR2 (A2) at its L side. Since control signal WB2 is also at the L level, multiplexer 25 outputs storage data WD1 (D2) at its L side. Therefore, in clock cycle t4, data D2 are written into memory array circuit 120, to a memory cell corresponding to address A2. Read data register DReg.3 is disabled since control signal RB is at the H level and the reading operation is not performed. The output of logic gate 27 is at the L level since control signal WB2 is at the L level, and thus, buffer circuit 28 outputs no read data.

Further, in clock cycles t1 through t4, control signal WB1 is held at the L level and control signal RB is held at the H level. Thus, address comparison circuits 30A and 32A are both disabled and perform no address comparisons. As the reading operation is not designated during this period, there is no need to set a data path for read data register DReg.3. Writing of data D1 and D2 for addresses A1 and A2 is performed without fail even in the absence of the address comparison. It is understood that power consumption is reduced by avoiding unnecessary address comparing operations.

In clock cycle t5, write enable signal WE# goes from the L level to the H level. Thus, in this clock cycle, a reading operation is designated for the memory array circuit. Address A5 input into the address input terminal in clock cycle t5 is taken in by address register AReg.0 and appears as input address AR0.

Control signals WB1 and WB2 are both at the L level at the activation timing of reference clock signal CLK in clock cycle t5. Thus, address registers AReg.1, AReg.2 and data registers DReg.1, DReg.2 are all enabled. In response, addresses A4 and A3 stored in address registers AReg.0 and AREG.1 at the previous clock cycle t4 appear as storage addresses AR1 and AR2, respectively. Further, data D3 corresponding to address A3 for which writing was designated in clock cycle t3 are input to data terminal 19. The data in data terminal 19 and in data register DReg.1 are taken into the succeeding data registers DReg.1 and DReg.2, respectively, and storage data WD1 and WD2 are updated to data D3 and D2, correspondingly.

At cycle t5, write enable signal WE# is at the H level, and therefore, control signal WB1 goes from the L level to the H level. Control signal WB2 is set at the L level by write enable register WReg.2, that is the same level as control signal WB1 at the previous clock cycle.

The access to memory array circuit 120 in clock cycle t5 is performed as follows. A reading operation is designated for memory array circuit 120 since control signal WB1 is set at the H level and control signal RB is set at the L level. Since control signal WB1 is at the H level, multiplexer 24 transmits input address AR0 (A5) at its H side to memory array circuit 120. Thus, in clock cycle t5, a reading operation is performed for a memory cell corresponding to address A5.

Address comparison circuits 30A and 32A are enabled in response to the activation of control signal RB (to the L level). Address comparison circuit 30A performs matching of addresses A5 and A3. Address comparison circuit 32A performs matching of addresses A5 and A4. When addresses A5 and A4 match, address match signal EQ1A is activated (to an H level). When addresses A5 and A3 match, address match signal EQ2A is activated (to an H level). The output of logic gate 35 is set to an H level in the case where address match signal EQ1A is activated and also in the case where both of address match signals EQ1A and EQ2A are activated. Thus, buffer circuit 36 is activated to form path 4, and data (D4) supplied to data terminal 19 are transmitted to read data register DReg.3. In the case where only address match signal EQ2A is activated, it means that input address A5 matches address A3 that corresponds to storage address AR2. Thus, path 2 is selected, and data D3 corresponding to storage data WD1 are transmitted to read data register DReg.3. If addresses A5≠A4≠A3, address match signals EQ1A and EQ2A are both in an inactive state. Thus, path 1 is selected, and data read out of memory array circuit 120 are transmitted to read data register DReg.3.

As explained above, in the clock cycle in which the reading operation is designated, the address comparison circuits are enabled to perform matching of the input address with storage addresses corresponding to storage data not yet written into the memory array circuit. Thus, appropriate read data are transmitted to read data register DReg.3. The data transmitted are retained by data register DReg.3, but the data are not output to the data terminal, because control signal WB2 is at the L level and buffer circuit 28 is in a disabled state.

Next, in clock cycle t6, write enable signal WE# is still at the H level. Thus, in this clock cycle, a reading operation is designated for the memory array circuit. Address A6 input to the address input terminal is taken in by address register AReg.0 and appears as input address AR0.

At the activation timing of reference clock signal CLK in clock cycle t6, control signal WB1 is at the H level and control signal WB2 is at the L level. Thus, address registers AReg.1 and AReg.2 are disabled, while data registers DReg.1 and DReg.2 are enabled. In response, addresses A4 and A3 in clock cycle t5 are retained as storage addresses AR1 and AR2, respectively. Data D4 corresponding to address A4 for which writing was designated in clock cycle t4 are input to data terminal 19. The data in data terminal 19 and in data register DReg.1 are taken in to the succeeding data registers DReg.1 and DReg.2, respectively, and storage data WD1 and WD2 are updated to data D4 and D3, correspondingly. Read data register DReg.3 takes in read data D (A5) corresponding to address A5 output from the data path select circuit in clock cycle t5. However, buffer circuit 28 is in a disabled state since control signal WB2 is at the L level, and therefore, data D (A5) taken into read data register DReg.3 are not output to the data terminal.

In clock cycle t6, write enable signal WE# is at the H level, and control signal WB1 is held at the H level. Control signal WB2 is changed from the L level to the H level by write enable register WReg.2.

For the access to memory array circuit 120 in clock cycle t6, a reading operation is performed since control signal RB is set at the L level and control signal WB1 is set at the H level. In response to control signal WB1 being at the H level, address multiplexer 24 transmits input address AR0 (A6) supplied to its H side to memory array circuit 120. Thus, in this cycle, a reading operation is performed for a memory cell corresponding to address A6.

Address comparison circuits 30A and 32A perform matching of input address A6 with storage addresses AR1 (A4) and AR2 (A3), respectively. When address A6 matches address A4, address match signal EQ1A is activated. When address A6 matches address A3, address match signal EQ2A is activated. In the case where addresses A6 and A4 match, and also in the case where addresses A6, A4 and A3 match, storage data WD1 (D4) are transmitted to read data register Dreg.3 via path 2. In the case where address A6 matches address A3 but address A6 does not match address A4, storage data WD2 (D3) are transmitted to read data register DReg.3 through path 3 to read out data D3 corresponding to address A3. If input address A6 does not match storage address A3 or A4, the read data from the memory array circuit are transmitted to read data register DReg.3 through path 1.

Next, in clock cycle t7, write enable signal WE# is still at the H level, and therefore, a reading operation is designated to the memory array circuit in this clock cycle. Address A7 input to the address input terminal is taken in by address register AReg.0 and appears as input address AR0.

Control signals WB1 and WB2 are both at the H level at the activation timing of reference clock signal CLK in clock cycle t7. Therefore, address registers AReg.1, AReg.2 and data registers DReg.1, DReg.2 are all disabled. In response, addresses A4 and A3 in clock cycle t6 are retained as storage addresses AR1 and AR2, respectively, and data D4 and D3 in clock cycle t6 are retained as storage data WD1 and WD2, respectively. Further, buffer circuit 28 is enabled since control signal WB2 is at the H level, and read data D (A5) corresponding to address A5 retained at read data register DReg.3 are output to the data terminal. Read data register DReg.3 then takes in data D (A6) corresponding to address A6 output from the data path select circuit in clock cycle t6.

Further, in clock cycle t7, write enable signal WE# is still at the H level, and therefore, control signals WB1 and WB2 are both held at the H level.

For the access to memory array circuit 120 in this clock cycle, a reading operation is performed because control signal RB is set at the L level and control signal WB1 is set at the H level. In response to control signal WB1 being at the H level, address multiplexer 24 transmits input address AR0 (A7) supplied to its H side to memory array circuit 120. Thus, in this cycle, a reading operation is performed for a memory cell corresponding to address A7.

Matching is performed between input address AR0 (A7) and storage addresses AR1 (A4), AR2 (A3), and, according to the matching result, any path among paths 1, 2 and 3 as described above is selected for transmission of corresponding data to read data register DReg.3.

Next, in clock cycle t8, write enable signal WE# is still at the H level. Thus, a reading operation is designated for the memory array circuit in this cycle. Address A8 input to the address input terminal is taken in by address register AReg.0 and appears as input address AR0.

Control signals WB1 and WB2 are both at the H level at the activation timing of reference clock signal CLK in clock cycle t8. Therefore, address registers AReg.1, AReg.2 and data registers DReg.1, DReg.2 are all disabled. In response, addresses A4 and A3 in clock cycle t7 are retained as storage addresses AR1 and AR2, respectively, and data D4 and D3 in clock cycle t7 are retained as storage data WD1 and WD2, respectively. Further, since control signal WB2 is at the H level, buffer circuit 28 is enabled, and read data D (A6) corresponding to address A6 retained at read data register DReg.3 are output to the data terminal. Read data register DReg.3 then takes in data D (A7) corresponding to address A7 output from the data path select circuit in clock cycle t7.

In clock cycle t8, write enable signal WE# is still at the H level, and therefore, control signals WB1 and WB2 are both held at the H level. For the access to memory array circuit 120, a reading operation is performed because control signal WB1 is set at the H level and control signal RB is set at the L level. In response to control signal WB1 being at the H level, address multiplexer 24 transmits input address AR0 (A8) supplied to its H side to memory array circuit 120. Thus, in this cycle, a reading operation is performed for a memory cell corresponding to address A8.

Matching of input address AR0 (A8) with storage addresses AR1 (A4), AR2 (A3) is performed and, according to the matching result, any one of the paths 1, 2 and 3 as described above is selected for transmission of corresponding data to read data register DReg.3.

Next, in clock cycle t9, write enable signal WE# is changed to the L level. Therefore, a writing operation is designated for the memory array circuit in this clock cycle. Address A9 input to the address input terminal is taken in by address register AReg.0 and appears as input address AR0.

However, the change in write enable signal WE# is reflected to control signal WB1 only after write enable signal WE# is taken in by write enable register WReg.1. Thus, at the activation timing of reference clock signal CLK in clock cycle t9, control signals WB1 and WB2 are both at the H level. Accordingly, address registers AReg.1, AReg.2 and data registers DReg.1, DReg.2 are all disabled. In response, addresses A4 and A3 in clock cycle t8 are retained as storage addresses AR1 and AR2, respectively, and data D4 and D3 in clock cycle t8 are retained as storage data WD1 and WD2, respectively. Buffer circuit 28 is enabled since control signal WB2 is at the H level, and read data D (A7) corresponding to address A7 retained in read data register DReg.3 are output to the data terminal. Read data register DReg.3 then takes in data D (A8) corresponding to address A8 output from the data path select circuit in clock cycle t8.

In clock cycle t9, write enable signal WE# is at the L level. Thus, control signal WB1 changes from the H level to the L level, and control signal WB2 is held at the H level. For the access to memory array circuit 120, a writing operation is performed since control signal WB1 is set at the L level. In response to control signal WB1 at the L level, address multiplexer 24 outputs address AR2 (A3) at its L side. As control signal WB2 is at the H level, data multiplexer 25 outputs storage data WD2 (D3) at its H side. Thus, in this clock cycle, data D3 are written into memory array circuit 120, to a memory cell corresponding to address A3.

Next, in clock cycle t10, write enable signal WE# is set at the L level, and therefore, a writing operation is designated for the memory array circuit in this clock cycle. Address A10 input to the address input terminal is taken in by address register AReg.0 and appears as input address AR0.

At the activation timing of reference clock signal CLK in clock cycle t10, control signal WB1 is at the L level and control signal WB2 is at the H level. Therefore, address registers AReg.1, AReg.2 are enabled, while data registers DReg.1, DReg.2 are disabled. In response, storage addresses AR1 and AR2 are updated to addresses A9 and A4, respectively, while data D4 and D3 in clock cycle t9 are retained as storage data WD1 and WD2, respectively. Further, since control signal WB2 is at the H level, buffer circuit 28 is enabled, and read data D (A8) corresponding to address A8 retained in read data register DReg.3 are output to the data terminal. However, control signal RB is at the H level because control signal WB1 is at the L level, and therefore, read data register DReg.3 does not take in new read data, but retains read data D (A8).

Further, in clock cycle t10, write enable signal WE# is at the L level. Thus, control signal WB1 is held at the L level, and control signal WB2 changes from the H level to the L level. For the access to memory array circuit 120, a writing operation is performed because control signal WB1 is set at the L level. In response to control signal WB1 at the L level, address multiplexer 24 outputs address AR2 (A4) at its L side. Since control signal WB2 is at the L level, data multiplexer 25 outputs storage data WD1 (D4) at its L side. Thus, in this clock cycle, data D4 are written into memory array circuit 120, to a memory cell corresponding to address A4.

During clock cycles t9 and t10, control signal WB1 is at the L level and control signal RB is held at the H level. Therefore, address comparison circuits 30A and 32A are disabled and perform no address comparison. The data writing operation, however, is performed successfully as in the case of FIG. 9, even in the absence of the address comparing operation. Thus, it is understood that the power consumption is reduced by avoiding unnecessary address comparing operations.

Next, in clock cycle t11, write enable signal WE# changes to the H level, and therefore, a reading operation is designated to the memory array circuit in this clock cycle. Address A11 input to the address input terminal is taken in by address register AReg.0 and appears as input address AR0.

Further, control signals WB1 and WB2 are both at the L level at the activation timing of reference clock signal CLK in clock cycle t11. Therefore, address registers AReg.1, AReg.2 and data registers DReg.1, DReg.2 are all enabled. In response, storage addresses AR1 and AR2 are updated to addresses A10 and A9, respectively. Further, since control signal WB2 is at the L level, data D9 corresponding to address A9 for which writing was designated at clock cycle t9 are input to the data terminal. The data in data terminal 19 and in data register DReg.1 are taken into the succeeding data registers DReg.1 and DReg.2, and therefore, storage data WD1 and WD2 are updated to data D9 and D4, respectively. Buffer circuit 28 is disabled, and read data register DReg.3 retains read data D (A8).

Further, in clock cycle t11, write enable signal WE# changes to the H level, and therefore, control signal WB1 goes from the L level to the H level, while control signal WB2 keeps its L level. For the access to memory array circuit 120, a reading operation is performed because control signal WB1 is set at the H level and control signal RB is set at the L level. In response to control signal WB1 at the H level, address multiplexer 24 transmits input address AR0 (A11) supplied to its H side to memory array circuit 120. Thus, in this cycle, a reading operation is performed for a memory cell corresponding to address A11.

Matching of input address AR0 (A11) with storage addresses AR1 (A10), AR2 (A9) is performed and, according to the matching result, any one of paths 1, 2 and 4 is selected, as in cycle time t5, for transmission of corresponding data to read data register DReg.3.

Next, in clock cycle t12, write enable signal WE# changes to L level. Thus, in this clock cycle, a writing operation is designated to the memory array circuit. Address A12 input to the address input terminal is taken in by address register AReg.0 and appears as input address AR0.

At the activation timing of reference clock signal CLK in clock cycle t12, control signal WB1 is at the H level and control signal WB2 is at the L level. Thus, address registers AReg.1, AReg.2 are disabled, while data registers DReg.1, DReg.2 are enabled. In response, addresses A10 and A9 are retained as storage addresses AR1 and AR2, respectively. Since control signal WB2 is at the L level, data D10 corresponding to address A10 for which writing was designated in clock cycle t10 are input to the data terminal. The data in data terminal 19 and in data register DReg.1 are taken into the succeeding data registers DReg.1 and DReg.2, respectively, and therefore, storage data WD1 and WD2 are updated to data D10 and D9, respectively. Buffer circuit 28 is disabled, and no read data are output to the data terminal. Read data register DReg.3 takes in data D (A11) corresponding to address A11 output from the data path select circuit in clock cycle t11.

Further, write enable signal WE# is at the L level in clock cycle t12. Thus, control signal WB1 changes from the H level to the L level, and control signal WB2 changes from the L level to the H level. For the access to memory array circuit 120, a writing operation is performed since control signal WB1 is set at the L level. In response to control signal WB1 at the L level, address multiplexer 24 outputs address AR2 (A9) at its L side. As control signal WB2 is at the H level, data multiplexer 25 outputs storage data WD2 (D9) at its H side. Thus, in this clock cycle, data D9 are written into memory array circuit 120, to a memory cell corresponding to address A9.

Next, in clock cycle t3, write enable signal WE# is changed to the H level. Therefore, a reading operation is designated for the memory array circuit in this clock cycle. Address A13 input to the address input terminal is taken in by address register AReg.0 and appears as input address AR0.

At the activation timing of reference clock signal CLK in clock cycle t13, control signal WB1 is at the L level and control signal WB2 is at the H level. Therefore, address registers AReg.1, AReg.2 are enabled, while data registers DReg.1, DReg.2 are disabled. In response, storage addresses AR1 and AR2 are updated to addresses A12 and A10, respectively. Data D10 and D9 in clock cycle t12 are retained as storage data WD1 and WD2, respectively. Buffer circuit 28 is enabled as control signal WB2 is at the H level, and read data D (A11) corresponding to address A11 retained in read data register DReg.3 are output to the data terminal. Since control signal WB1 is at the L level, control signal RB is at the H level, and therefore, read data register DReg.3 does not take in new read data, but retains read data D (A11).

Further, in clock cycle t13, write enable signal WE# is at the H level. Thus, control signal WB1 changes from the L level to the H level, while control signal WB2 changes from the H level to the L level. For the access to memory array circuit 120, a reading operation is performed because control signal WB1 is set at the H level and control signal RB is set at the L level. In response to control signal WB1 being at the H level, multiplexer 24 transmits input address AR0 (A13) supplied to its H side to memory array circuit 120. Thus, in this cycle, a reading operation is performed for a memory cell corresponding to address A13.

Matching of input address AR0 (A13) with storage addresses AR1 (A12), AR2 (A10) is performed and, according to the matching result, any one of paths 1, 2 and 4 is selected, as in cycle time t5, so that corresponding data are transmitted to read data register DReg.3.

Next, in clock cycle t14, write enable signal WE# is at the H level, and therefore, a reading operation is designated for the memory array circuit in this clock cycle. Address A14 input to the address input terminal is taken in by address register AReg.0, and appears as input address AR0.

At the activation timing of reference clock signal CLK in clock cycle t14, control signal WB1 is at the H level and control signal WB2 is at the L level. Therefore, address registers AReg.1, AReg.2 are disabled, while data registers DReg.1, DReg.2 are enabled. In response, addresses A12 and A10 are retained as storage addresses AR1 and AR2, respectively.

Further, as control signal WB2 is at the L level, data D12 corresponding to address A12 for which writing was designated in clock cycle t12 are input to the data terminal. The data in data terminal 19 and in data register DReg.1 are taken into the succeeding data registers DReg.1 and DReg.2, respectively, and therefore, storage data WD1 and WD2 are updated to respective data D12 and D10. Buffer circuit 28 is disabled, and no read data are output to the data terminal. Read data register DReg.3 takes in data D (A13) corresponding to address A13 output from the data path select circuit in clock cycle t13.

Further, in clock cycle t14, write enable signal WE# is at the H level, and control signal WB1 keeps the H level. Control signal WB2 changes from the L level to the H level. For the access to memory array circuit 120, a reading operation is performed because control signal WB1 is set at the H level and control signal RB is set at the L level. In response to control signal WB1 being at the H level, address multiplexer 24 transmits input address AR0 (A14) supplied to its H side to memory array circuit 120. Thus, in this cycle, a reading operation is performed for a memory cell corresponding to address A14.

Matching of input address AR0 (A14) with storage addresses AR1 (A12), AR2 (A10) is performed and, according to the matching result, any one of paths 1, 2 and 3 is selected, as in cycle time t6, for transmission of corresponding data to read data register DReg.3.

Next, in clock cycle t15, write enable signal WE# changes to the L level, and in this clock cycle, a writing operation is designated to the memory array circuit. Address A15 input to the address input terminal is taken in by address register AReg.0, and appears as input address AR0.

However, at the activation timing of reference clock signal CLK in clock cycle t15, control signals WB1 and WB2 are both at the H level. Therefore, address registers AReg.1, AReg.2 and data registers DReg.1, DReg.2 are all disabled. In response, addresses A12 and A10 in clock cycle t14 are retained as storage addresses AR1 and AR2, respectively, and data D12 and D10 in clock cycle t14 are retained as storage data WD1 and WD2, respectively. Buffer circuit 28 is enabled as control signal WB2 is at the H level, and read data D (A13) corresponding to address A13 retained in read data register DReg.3 are output to the data terminal. Further, read data register DReg.3 takes in data D (A14) corresponding to address A14 output from the data path select circuit in clock cycle t14.

Further, in clock cycle t15, writing enable signal WE# is at the L level, and control signal WB1 changes from the H level to the L level. Control signal WB2 keeps its H level. For the access to memory array circuit 120, a writing operation is performed since control signal WB1 is set at the L level. In response to control signal WB1 at the L level, address multiplexer 24 outputs address AR2 (A10) at is L side. As control signal WB2 is at the H level, data multiplexer 25 outputs storage data WD2 (D10) at its H side. Thus, in this clock cycle, data D10 are written into memory array circuit 120, to a memory cell corresponding to address A10.

Next, in clock cycle t16, write enable signal WE# changes to the H level. In this clock cycle, a reading operation is designated for the memory array circuit. Address A16 input to the address input terminal is taken in by address register AReg.0, and appears as input address AR0.

At the activation timing of reference clock signal CLK in clock cycle t16, control signal WB1 is at the L level and control signal WB2 is at the H level. Therefore, address registers AReg.1, AReg.2 are enabled, while data registers DReg.1, DReg.2 are disabled. In response, storage addresses AR1 and AR2 are updated to addresses A15 and A12, respectively, while data D12 and D10 are retained as, storage data WD1 and WD2, respectively. Further, as control signal WB2 is at the H level, buffer circuit 28 is enabled, and read data D (A14) corresponding to address A14 retained in read data register DReg.3 are output to the data terminal. However, since control signal WB1 is at the L level, control signal RB is at the H level. Therefore, read data register DReg.3 does not take in new read data, but retains read data D (A14).

Further, in clock cycle t16, write enable signal WE# is at the H level, and control signal WB1 changes from the L level to the H level. Control signal WB2 changes from the H level to the L level. For the access to memory array circuit 120, a reading operation is performed because control signal WB1 is set at the H level and control signal RB is set at the L level. In response to control signal WB1 at the H level, address multiplexer 24 transmits input address AR0 (A16) supplied to its H side to memory array circuit 120. Thus, in this cycle, a reading operation is performed for a memory cell corresponding to address A16.

Matching of input address AR0 (A16) with storage addresses AR1 (A15), AR2 (A12) is performed and, accord-ing to the matching result, any one of paths 1, 2 and 4 is selected, as in cycle time t5, for transmission of corresponding data to read data register DReg.3.

Next, in clock cycle t17, write enable signal WE# is set at the L level. In this clock cycle, a writing operation is designated for the memory array circuit. Address A17 input to the address input terminal is taken in by address register AReg.0 and appears as input address AR0.

At the activation timing of reference clock signal CLK in clock cycle t17, control signal WB1 is at the H level and control signal WB2 is at the L level. Therefore, address registers AReg.1, AReg.2 are disabled, while data registers DReg.1, DReg.2 are enabled. In response, addresses A15 and A12 are retained as storage addresses AR1 and AR2, respectively. Since control signal WB2 is at the L level, data D15 corresponding to address A15 for which writing was designated in clock cycle t15 are input to the data terminal. The data in data terminal 19 and in data register DReg.1 are taken in by the succeeding data registers DReg.1 and DReg.2, respectively, and therefore, storage data WD1 and WD2 are updated to data D15 and D12, respectively. Buffer circuit 28 is disabled, and no read data are output to the data terminal. Read data register DReg.3 takes in data D (A16) corresponding to address A16 output from the data path select circuit in clock cycle t16.

Further, in clock cycle t17, write enable signal WE# is at the L level, and control signal WB1 changes from the H level to the L level. Control signal WB2 changes from the L level to the H level. For the access to memory array circuit 120, a writing operation is performed since control signal WB1 is set at the L level. In response to control signal WB1 at the L level, address multiplexer 24 outputs address AR2 (A12) at its L side. Since control signal WB2 is at the H level, data multiplexer 25 outputs storage data WD2 (D12) at its H side. Thus, in this clock cycle, data D12 are written into memory array circuit 120, to a memory cell corresponding to address A12.

Next, in clock cycle t18, write enable signal WE# is set at the L level. In this clock cycle, a writing operation is designated for the memory array circuit. Address A18 input to the address input terminal is taken in by address register AReg.0, and appears as input address AR0.

At the activation timing of reference clock signal CLK in clock cycle t18, control signal WB1 is at the L level and control signal WB2 is at the H level. Therefore, address registers AReg.1, AReg.2 are enabled, while data registers DReg.1, DReg.2 are disabled. In response, storage addresses AR1 and AR2 are updated to addresses A17 and A15, respectively, while data D15 and D12 in clock cycle t17 are retained as storage data WD1 and WD2, respectively. Further, since control signal WB2 is at the H level, buffer circuit 28 is enabled, and read data D (A16) corresponding to address A16 retained in read data register DReg.3 are output to the data terminal. However, since control signal WB1 is at the L level and control signal RB is at the H level, read data register DReg.3 does not take in new read data, but retains read data D (A16).

Further, in clock cycle t18, write enable signal WE# is at the L level, and control signal WB1 is held at the L level. Control signal WB2 changes from the H level to the L level. For the access to memory array circuit 120, a writing operation is performed since control signal WB1 is set at the L level. In response to control signal WB1 at the L level, address multiplexer 24 outputs address AR2 (A15) at its L side. Since control signal WB2 is also at the L level, data multiplexer 25 outputs storage data WD1 (D15) at its L side.

Thus, in this clock cycle, data D15 are written into memory array circuit 120, to a memory cell corresponding to address A15.

Next, in clock cycle t19, write enable signal WE# is set at the L level. In this clock cycle, a writing operation is also designated for the memory array circuit. Address A19 input to the address input terminal is taken in by address register AReg.0, and appears as input address AR0.

At the activation timing of reference clock signal CLK in clock cycle t19, control signals WB1 and WB2 are both at the L level, and therefore, address registers AReg.1, AReg.2 and data registers DReg.1, DReg.2 are all enabled. In response, storage addresses AR1 and AR2 are updated to addresses A18 and A17, respectively. Further, data D17 corresponding to address A17 for which writing was designated in clock cycle t17 are input to data terminal 19, and storage data WD1 and WD2 are updated to data D17 and D15, respectively.

In clock cycle t19, write enable signal WE# is still at the L level, and control signal WB1 is set at the L level. Control signal WB2 is set to the L level by write enable register WReg.2, which is the same level as control signal WB1 at the previous clock cycle. The access to memory array circuit 120 is performed as follows. In this clock cycle, control signal WB1 is at the L level, and complementarily set control signal RB is at the H level, and therefore, a writing operation is set for memory array circuit 120. In response to control signal WB1 being at the L level, address multiplexer 24 outputs address AR2 (A17) at its L side. Since control signal WB2 is also at the L level, data multiplexer 25 outputs storage data WD1 (D17) at its L side. Thus, in this clock cycle, data D17 are written into memory array circuit 120, to a memory cell corresponding to address A17. Further, since control signal RB is at the H level, no reading operation is performed, and read data register DReg.3 is disabled. Since control signal WB2 is at the L level, buffer circuit 28 outputs no read data.

Next, in clock cycle t20, write enable signal WE# is set at the L level, and in this clock cycle, a writing operation is designated to the memory array circuit. Address A20 input to the address input terminal is taken in by address register AReg.0, and appears as input address AR0.

At the activation timing of reference clock signal CLK in clock cycle t20, control signals WB1 and WB2 are both at the L level, and therefore, address registers AReg.1, AReg.2 and data registers DReg.1, DReg.2 are all enabled. In response, storage addresses AR1 and AR2 are updated to addresses A19 and A18, respectively. Further, data D18 corresponding to address A18 for which writing was designated in clock cycle t18 are input to the data terminal. Storage data WD1 and WD2 are thus updated to data D18 and D17, respectively.

As write enable signal WE# is at the L level in clock cycle t20, control signal WB1 is set at the L level. Control signal WB2 is set at the L level that is the same level as control signal WB1 at the previous clock cycle. In this clock cycle, control signal WB1 is at the L level, and complementarily set control signal RB is at the H level. Thus, a writing operation is designated for memory array circuit 120. In response to control signal WB1 at the L level, address multiplexer 24 outputs address AR2 (A18) at its L side. Since control signal WB2 is also at the L level, data multiplexer 25 outputs storage data WD1 (D18) at its L side. Thus, in this clock cycle, data D18 are written into memory array circuit 120, to a memory cell corresponding to address A18. Further, since control signal RB is at the H level and no reading operation is performed, read data register DReg.3 is disabled. As control signal WB2 is at the L level, buffer circuit 28 outputs no read data.

In clock cycle t21, write enable signal WE# is also at the L level, and control signal WB1 is set at the L, level. Control signal WB2 is set at the L level, which is the same level as control signal WB1 at the previous clock cycle. In this clock cycle, a writing operation is set for memory array circuit 120, since control signal WB1 is at the L level and control signal RB is complementarily set at the H level. In response to control signal WB1 at the L level, address multiplexer 24 outputs address AR2 (A19) at its L side. Data multiplexer 25 outputs storage data WD1 (D19) at its L side as control signal WB2 is also at the L level. Thus, in this clock cycle, data D19 are written into memory array circuit 120, to a memory cell corresponding to address A19. As control signal RB is at the H level and no reading operation is performed, read data register DReg.3 is disabled. As control signal WB2 is at the L level, buffer control circuit 28 outputs no read data.

In clock cycle t5 as well as during clock cycles t17 through t21, control signal WB1 is at the L level and control signal RB is at the H level, and therefore, address comparison circuits 30A and 32A are disabled and perform no address comparisons. The data writing operations as in the case of FIG. 9, however, are performed without fail, even if no address comparisons are performed. It is thus understood that power consumption is reduced effectively by avoiding unnecessary address comparing operations.

Second Embodiment

Figure 4:
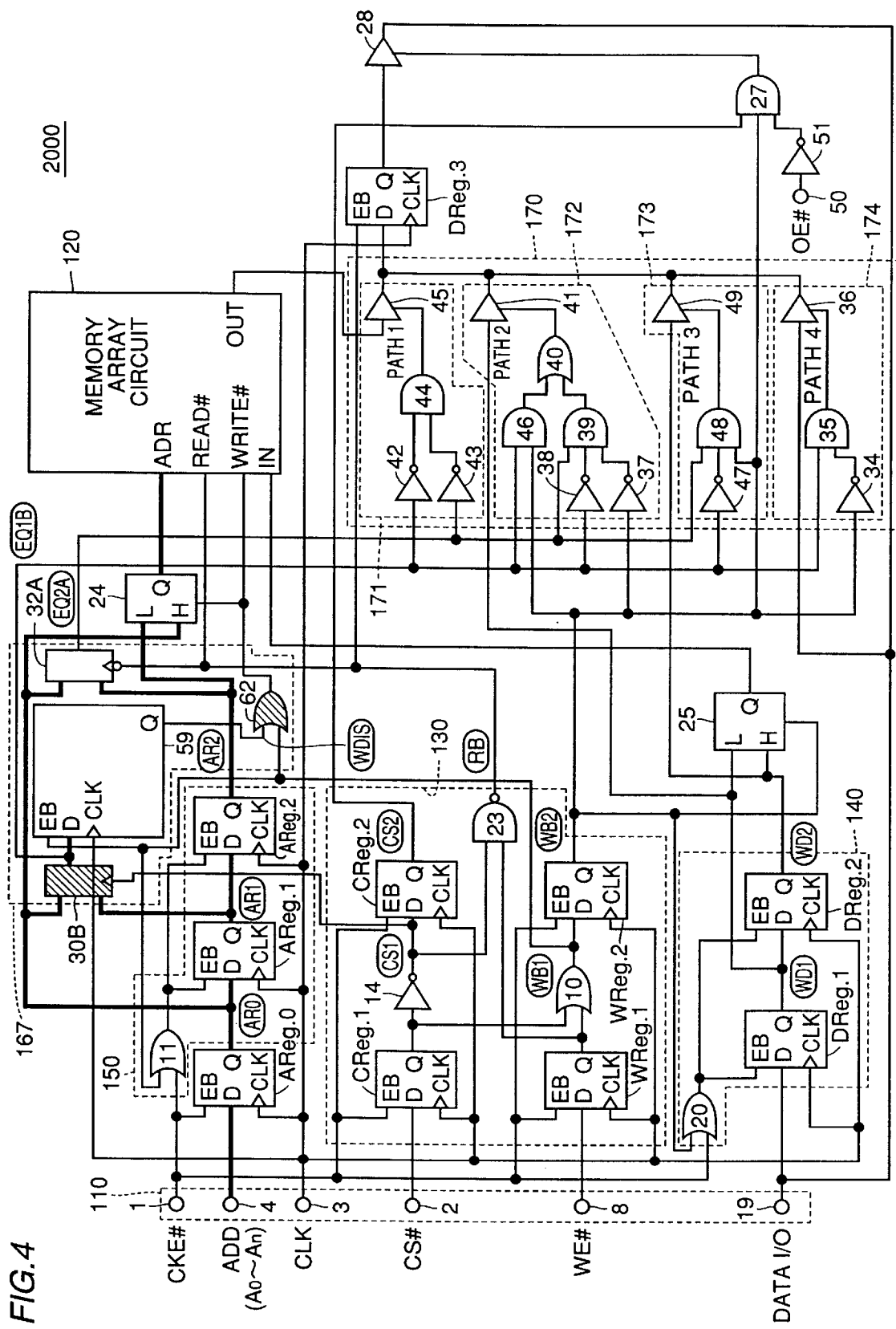
FIG. 4 is a block diagram showing a configuration of a synchronous semiconductor memory device 2000 according to a second embodiment of the present invention.

Referring to FIG. 4, semiconductor memory device 2000 according to the second embodiment differs from semiconductor memory device 1000 according to the first embodiment in that it has an address matching circuit 167 instead of address matching circuit 165.

Address matching circuit 167 includes: an address comparison circuit 30B that compares input address AR0 with storage address AR1; a comparison result register 59 that retains the comparison result of address comparison circuit 30B; an address comparison circuit 32A that performs matching of input address AR0 with storage address AR2; and a logic gate 62 that receives a control signal WDIS being an output of comparison result register 59 and control signal WB1 as its two inputs to output their OR logical operation result to signal terminal WRITE# of memory array circuit 120.

Address comparison circuit 30B is enabled when control signal CS1 is at the H level, i.e., when the chip is in a selected state, and performs matching of input address AR0 with storage address AR1. When they match, address comparison circuit 30B activates an address match signal EQ1B (to an H level).

Comparison result register 59 is enabled when control signal WB1 is activated (to the L level), i.e., at a cycle in which the chip is selected and a writing operation is designated, and takes in address match signal EQ1B input to its D terminal for output from its Q terminal. Thus, comparison result register 59 takes in and retains address match signal EQ1B when input address AR0 is an address associated with the writing operation, and outputs the same as control signal WDIS.

Accordingly, even when control signal WB1 is activated (to the L level) at a cycle in which the chip is selected and a writing operation is designated, if control signal WDIS is activated (to the H level) by comparison result register 59, the output of logic gate 62 is inactivated (to the H level), and no writing operation is performed for memory array circuit 120. Thus, in the case where another writing is designated for the same address as storage address AR2, i.e., when the writing operations are continuously designated for the same address, the writing operation of the write data that were previously input to memory array circuit 120 is canceled.

Address match signal EQ1B, which is activated (to the H level) when input address AR0 matches storage address AR1, is a signal having basically the same state as address match signal EQ1A described in the first embodiment. Therefore, data path select circuit 170 can set the data paths similar to those in the first embodiment, according to address match signals EQ1B and EQ2A.

Address comparison circuit 32A in this embodiment has a configuration identical to that of address comparison circuit 32A described in the first embodiment. It operates only in the clock cycle in which control signal RB is at the H level, i.e., in the clock cycle in which the chip is selected and the reading operation is designated, and performs matching of input address AR0 with storage address AR2. When they match, address comparison circuit 32A activates address match signal EQ2A (to the H level).

Other circuit configurations and the basic operation at the time of reading/writing of semiconductor memory device 2000 are the same as those of semiconductor memory device 1000, and thus, description thereof is not repeated here.

The configurations of address comparison circuit 30B and comparison result register 59 will now be described in more detail with reference to FIG. 5.

Figure 5:
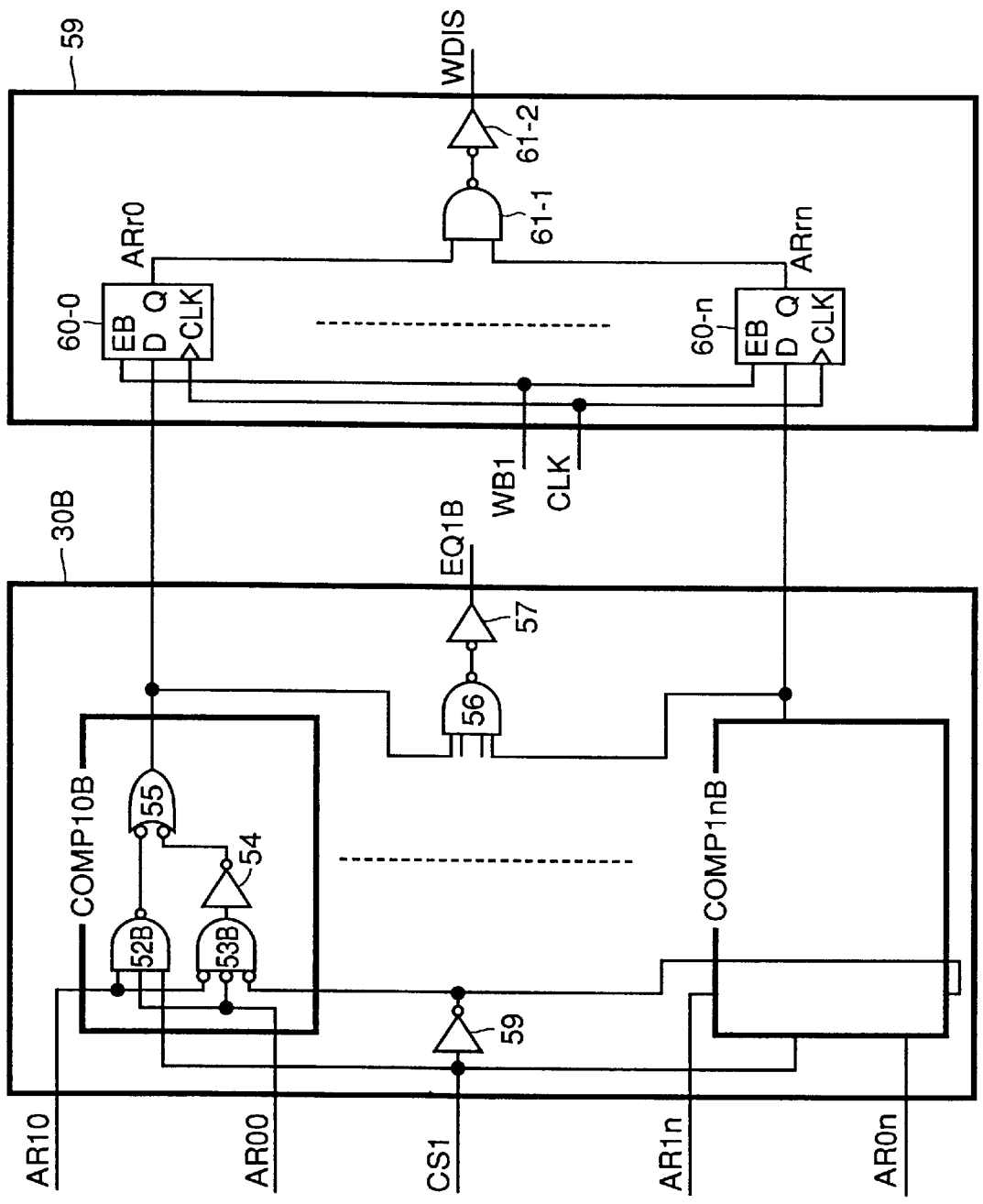
FIG. 5 is a block diagram showing configurations of an address comparison circuit 30B and a comparison result register 59.

Referring to FIG. 5, address comparison circuit 30B has address comparison units COMP10B to COMP1nB. Address comparison circuit 30B is provided with AR00 to AR0n corresponding to respective bits of input address AR0, and AR10 to AR1n corresponding to respective bits of storage address AR1.

Address comparison unit COMP10B includes: a logic gate 52B receiving a leading bit AR00 of the input address, a leading bit AR10 of storage address AR1 and control signal CS1 as its three inputs to output their NAND logical operation result; a logic gate 53B receiving inverted signals of bit signals AR00 and AR10 and control signal CS1 as its three inputs to output their AND logical operation result; an inverter 54 inverting an output of logic gate 53B; and a logic gate 55 receiving an inverted signal of the output of inverter 54 and an inverted signal of the output of logic gate 52B as its two inputs to output their OR logical operation result.

Logic gate 52B outputs a signal at the L level in the case where bit signals AR00 and AR10 both at the H level match with each other when control signal CS1 is at the H level, i.e., when the chip is in a selected state. Similarly, logic gate 53B outputs a signal at the H level in the case where the chip is in a selected state and bit signals AR00 and AR10 both at the L level match with each other, and in response, inverter 54 outputs a signal at the L level. Thus, logic gate 55 outputs a signal at the H level when AR00 and AR10 match with each other.

An address comparison unit having the same configuration is provided for each bit of the address signal. When the i-th address comparison unit is expressed as COMP1iB (i is an integer from 0 to n), address comparison unit COMP1iB compares the i-th bit AR0i of the input address with the i-th bit AR1i of storage address AR1, and, when they match, outputs the signal at the H level.

Address comparison circuit 30B further includes: a logic gate 56 receiving each output of address comparison units COMP10B to COMP1nB to output their NAND logical operation result; and an inverter 57 inverting an output of logic gate 56 to output address match signal EQ1B. The output of logic gate 56 attains an L level only when every bit pair of input address AR0 and storage address AR1 matches perfectly, and accordingly, address match signal EQ1B is activated (to the H level).

The outputs of respective address comparison units COMP10B to COMP1nB are also transmitted to comparison result register 59.

Comparison result register 59 has register circuits 60-0 to 60-n provided corresponding to respective address comparison units COMP10B to COMP1nB within address comparison circuit 30B. Each of register circuits 60-0 to 60-n receives control signal WB1 at its enable terminal, and is enabled in the writing operation cycle with the chip being selected. In response to the activation edge of reference clock signal CLK, each of register circuits 60-0 to 60-n outputs the output of corresponding address comparison unit COMP10B to COMP1nB input in its D terminal, from its Q terminal as control signal ARr0 to ARrn.

Comparison result register 59 further includes: a logic gate 61-1 receiving control signals ARr0 to ARrn to output their AND logical operation result; and an inverter 61-2 inverting an output of logic gate 61-1 to output control signal WDIS.

With such a configuration, control signal WDIS output from comparison result register 59 reflects address match signal EQ1B at a clock cycle in which the chip is in the selected state and the writing operation is designated, and, when another writing operation is consecutively designated for the same address, cancels the writing operation corresponding to the preceding write data.

The operation of semiconductor memory device 2000 according to the second embodiment will now be described with reference to the timing chart in FIG. 6.

Figure 6:
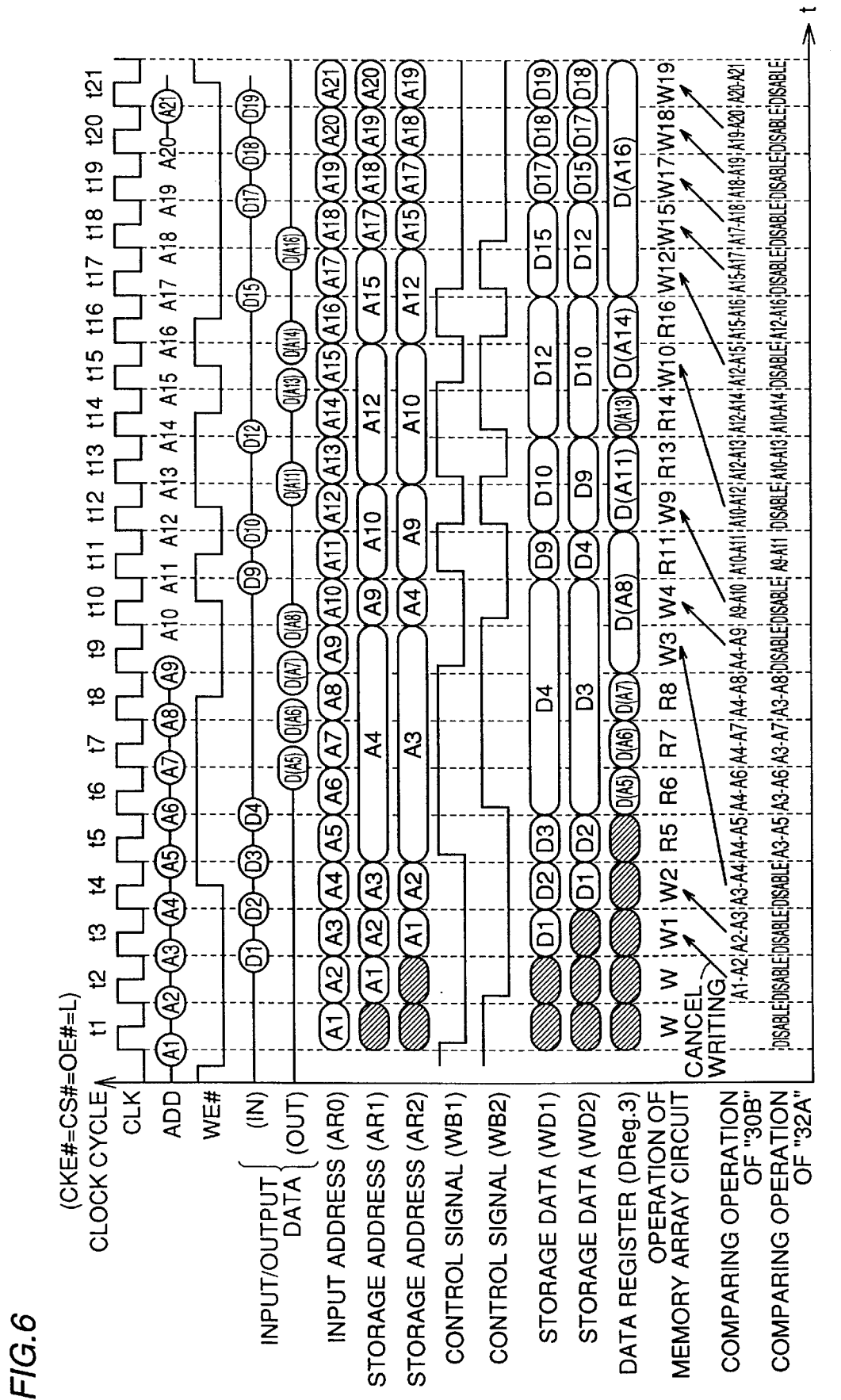
FIG. 6 is a timing chart illustrating the operation of synchronous semiconductor memory device 2000 according to the second embodiment.

Referring to FIG. 6, the transitions of input address and write enable signal WE# at each cycle are similar to those in the case of FIG. 3. Accordingly, input address (AR0) and storage addresses (AR1, AR2), as well as data being stored in each data register and control signals WB1 and WB2 at each clock cycle are all identical to those in FIG. 3. Therefore, the operation with respect to memory array circuit 120 is also set at each cycle according to the combination of the input address and the control signals designating reading/writing, in the same manner as in FIG. 3.

In semiconductor memory device 2000, matching of input address AR0 with storage address AR1 is performed at each clock cycle by address comparison circuit 30B. If they match with each other, it means that writing operations are consecutively designated for the same address. In this case, the unnecessary writing operation of the preceding data to the memory array circuit, which is performed at or later than the next clock cycle in the conventional case, is cancelled (as illustrated using arrows in FIG. 6), so that power consumption is further reduced.

Further, address comparison circuit 32A of the present embodiment, like address comparison circuit 32A described in the first embodiment, operates only when it is necessary to alter the data path, i.e., in the clock cycle in which the chip is in the selected state and a reading operation is designated. Therefore, even if the reading operation is designated for a storage address, it is possible to form a corresponding data path to send the read data to the data terminal without fail, while accomplishing the reduction in power consumption as in the first embodiment.

In semiconductor memory device 2000, it is also possible to adjust the number of stages of register circuits provided in control circuit 130, write data retaining circuit 140 and write address retaining circuit 150, as in semiconductor memory device 1000, so that an arbitrary k number (k is a natural number) of pieces of write data can be retained, and correspondingly, the timing difference between address input and data input/output can be set to k clock cycles. Even in that case, matching can be performed between the k number of storage addresses retained in the write address retaining circuit and the input address at each clock cycle, and thus, the same effects as described above can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device performing data input/output according to a control signal and an address signal in synchronization with a clock signal, comprising:
   a plurality of address terminals for receiving respective bits of said address signal;
   a data terminal for input/output of data;
   a memory array circuit for performing reading/writing of said data according to said address signal with respect to a plurality of memory cells arranged in rows and columns;
   a control circuit responsive to said control signal for designating one of a reading operation and a writing operation to said memory array circuit and for designating one of data input and data output to said data terminal, in synchronization with said clock signal;
   a data retaining circuit provided between said data terminal and said memory array circuit for taking in write data input into said data terminal at a clock cycle in which said data input is designated, and for temporarily retaining at least one piece of said write data as storage data until it is written into said memory cell;
   an address retaining circuit receiving said address signal from said plurality of address terminals for retaining at least one storage address signal corresponding to at least one piece of said storage data;
   an address select circuit receiving a read address signal being an address signal input into said address terminals for data output and said storage address signal, for selectively transmitting one of these address signals to said memory array circuit according to the operation designated to said memory array circuit;
   an address comparison circuit activated by said control circuit for performing matching of said read address signal with each said storage address signal at a clock cycle in which said reading operation is designated, and inactivated by said control circuit in a clock cycle other than said clock cycle in which said reading operation is designated;
   a read data select circuit responsive to the matching result of said address comparison circuit for selecting one data out of said write data, said storage data and read data from said memory array circuit that correspond to said read address signal; and
   a read data latch circuit for latching the data selected by said read data select circuit for transmission to said data terminal at a clock cycle in which said data output is designated.

2. The synchronous semiconductor memory device according to claim 1, wherein
   said control circuit takes in said control signal at an activation edge of said clock signal and activates a write control signal at a clock cycle in which the writing operation is designated to said memory array circuit,
   said data retaining circuit includes an N number (N is a natural number) of data register circuits connected in series between said data terminal and said memory array circuit,
   each of said N number of data register circuits operating in response to an activation edge of said clock signal at a clock cycle in which said data input is designated,
   the synchronous semiconductor memory device further comprises an address buffer circuit provided between said address terminal and said address retaining circuit for taking in said address signal in response to each activation edge of said clock signal, wherein
   said address retaining circuit includes an N number of address register circuits connected in series between said address buffer circuit and said address select circuit,
   each of said N number of address register circuits operating when said write control signal is activated at an activation edge of said clock signal at a clock cycle, and
   said data terminal performs said data input/output N clock cycles later than the input of said address signal.

3. The synchronous semiconductor memory device according to claim 2, wherein
   said control circuit takes in said control signal at an activation edge of said clock signal, and activates a read control signal at a clock cycle in which a reading operation is designated to said memory array circuit,
   said address comparison circuit includes an N number of address comparison sub-circuits which are provided corresponding to said N number of storage address signals and attain an enabled state at an activation of said read control signal,
   each of said address comparison sub-circuits performing matching of a corresponding one of said N number of storage address signals with said read address signal in said enabled state,
   when said read address signal matches one of said N number of storage address signals, said read data select circuit transmits data corresponding to the matched one of said storage address signals to said read data latch circuit, and, when said read address signal matches none of said N number of storage address signals, said read data select circuit transmits the read data from said memory array circuit to said read data latch circuit,
   when said read address signal matches more than one of said storage address signals, said read data select circuit transmits data corresponding to one of said matching storage address signals that was input most recently, to said read data latch circuit, and
   said N number of address comparison sub-circuits attain a disabled state at an inactivation of said read control signal.

4. The synchronous semiconductor memory device according to claim 3, wherein
   said read data select circuit includes a plurality of data path setting circuits provided between said data retaining circuit and said data terminal and said read data latch circuit, said plurality of data path setting circuits being disposed corresponding to said write data, the N number of said storage data and the read data from said memory array circuit corresponding to said read address signal, respectively, and any one of said plurality of data path setting circuits being selected according to comparison results of said N number of address comparison sub-circuits and an operation designated to said data terminal at a clock cycle in which said reading operation is designated, for transmission of corresponding data to said read data latch circuit.

5. The synchronous semiconductor memory device according to claim 2, wherein at an activation edge of said clock signal, if an address signal for data writing was input N clock cycles before, said control circuit designates said data input and drives said N number of data register circuits to an enabled state, and, if an address signal for data reading was input N clock cycles before, said control circuit designates said data output and causes the data latched at said read data latch circuit to be output to said data terminal.

6. A synchronous semiconductor memory device performing data input/output according to a control signal and an address signal in synchronization with a clock signal, comprising:

a plurality of address terminals for receiving respective bits of said address signal;

a data terminal for input/output of data;

a memory array circuit for performing reading/writing of said data according to said address signal with respect to a plurality of memory cells arranged in rows and columns;

a control circuit responsive to said control signal for designating one of a reading operation and a writing operation to said memory array circuit and for designating one of data input and data output to said data terminal, in synchronization with said clock signal;

a data retaining circuit provided between said data terminal and said memory array circuit for taking in write data input into said data terminal at a clock cycle in which said data input is designated, and for temporarily retaining at least one piece of said write data as storage data until it is written into said memory cell;

an address retaining circuit receiving said address signal from said plurality of address terminals for retaining at least one storage address signal corresponding to at least one piece of said storage data;

an address select circuit receiving a read address signal being an address signal input into said address terminals for data output and said storage address signal, for selectively transmitting one of these address signals to said memory array circuit according to the operation designated to said memory array circuit;

an address comparison circuit for performing matching of a write address signal being an address signal input to said address terminal for data writing with each of said storage address signals, said address comparison circuit canceling, when said write address signal matches the latest one of said storage address signals, said writing operation of said storage data corresponding to the matched one of said storage address signals to said memory array circuit;

a read data select circuit responsive to the matching result of said address comparison circuit for selecting one data out of said write data, said storage data and read data from said memory array circuit that correspond to said read address signal; and a read data latch circuit for latching the data selected by said read data select circuit for transmission to said data terminal at a clock cycle in which said data output is designated.

7. The synchronous semiconductor memory device according to claim 6, wherein said control circuit takes in said control signal at an activation edge of said clock signal and activates a write control signal at a clock cycle in which the writing operation is designated to said memory array circuit, said data retaining circuit includes an N number (N is a natural number) of data register circuits from a first data register circuit to an N-th data register circuit, connected in series between said data terminal and said memory array circuit, each of said N number of data register circuits operating in response to an activation edge of said clock signal at a clock cycle in which said data input is designated, and the synchronous semiconductor memory device further comprising an address buffer circuit provided between said address terminal and said address retaining circuit for taking in said address signal in response to an activation edge of said clock signal, where said address retaining circuit includes an N number of address register circuits from a first address register circuit to an N-th address register circuit, connected in series between said address buffer circuit and said address select circuit, each of said N number of address register circuits operating when said write control signal is activated at an activation edge of said clock signal at a clock cycle, and said data terminal performs corresponding said data input/output N clock cycles later than the input of said address signal.

8. The synchronous semiconductor memory device according to claim 7, wherein said N is 2, said address comparison circuit includes first and second address comparison sub-circuits provided corresponding to said storage address signals retained in said first and second address registers, said first address comparison sub-circuit performing matching of said input address with corresponding said storage address signal at a clock cycle in which one of said reading operation and writing operation is designated, and said second address comparison sub-circuit performing matching of said input address with corresponding said storage address signal at a clock cycle in which said reading operation is designated, and said address comparison circuit further includes:

a comparison result retaining circuit for retaining the matching result of said first address comparison sub-circuit at the clock cycle in which said writing operation is designated, and for outputting said matching result at a clock cycle in which said writing operation is designated next; and a logic circuit provided between said control circuit and said memory array circuit, responsive to said matching result output from said comparison result retaining circuit for inactivating said write control signal.

9. The synchronous semiconductor memory device according to claim 7, wherein when said read address signal matches one of said N number of storage address signals, said read data select circuit transmits data corresponding to the matched one of said storage address signals to said read data latch circuit, and, when said read address signal matches none of said N number of storage address signals, said read data select circuit transmits the read data from said memory array circuit to said read data latch circuit, and when said read address signal matches more than one of said storage address signals, said read data select circuit transmits data corresponding to one of said matching storage address signals that was input most recently, to said read data latch circuit.

10. The synchronous semiconductor memory device according to claim 9, wherein said read data select circuit includes a plurality of data path setting circuits provided between said data retaining circuit and said data terminal and said read data latch circuit, said plurality of data path setting circuits being disposed corresponding to said write data, the N number of said storage data and the read data from said memory array circuit corresponding to said read address signal, respectively, and any one of said plurality of data path setting circuits being selected according to comparison results of said N number of address comparison sub-circuits and an operation designated to said data terminal at a clock cycle in which said reading operation is designated, for transmission of corresponding data to said read data latch circuit.

11. The synchronous semiconductor memory device according to claim 7, wherein at an activation edge of said clock signal, if an address signal for data writing was input N clock cycles before, said control circuit designates said data input and drives said N number of data register circuits to an enabled state, and, if an address signal for data reading was input N clock cycles before, said control circuit designates said data output and causes the data latched at said read data latch circuit to be output to said data terminal.

12. A synchronous semiconductor memory device performing data input/output according to a control signal and an address signal in synchronization with a clock signal, comrprising:

a plurality of address terminals for receiving respective bits of said address signal;

a data terminal for input/output of data;

a memory array circuit for performing reading/writing of said data according to said address signal with respect to a plurality of memory cells arranged in rows and columns;

a control circuit responsive to said control signal for designating one of a reading operation and a writing operation to said memory array circuit and for designating one of data input and data output to said data terminal, in synchronization with said clock signal;

a data retaining circuit provided between said data terminal and said memory array circuit for taking in write data input into said data terminal at a clock cycle in which said data input is designated, and for temporarily retaining at least one piece of said write datsa as storage data until it is written into said memory cell;

an address retaining circuit receiving said address signal from said plurality of address terminals for retaining at least one storage address signal corresponding to at least one piece of said storage data;

an address select circuit receiving a read signal being an address signal input into said address terminals for data output and said storage address signal, for selectively transmitting one of these address signals of said memory array circuit according to the operation designated to said memory array circuit;

an address comparison circuit for performing matching of said read address signal with each said storage address signal in response to a clock cycle in which said reading operation is designated;

a read data select circuit responsive to the matching result of said address comparison circuit for selecting one data out of said write data, said storage data and read data from said memory array circuit that correspond to said read address signal; and a read data latch circuit for latching the data selected by said read data select circuit for transmission to said data terminal at a clock cycle in which said data output is designated.

13. The synchronous semiconductor memory device according to claim 12, wherein said control circuit takes in said control signal at an activation edge of said clock signal and activates a write control signal at a clock cycle in which the writing operation is designated to said memory array circuit, said data retaining circuit includes an N number (N is a natural number) of data register circuits connected in series betweens aid data terminal and said memory array circuit, each of said N number of data register circuits operating in response to an activation edge of said clock signal at a clock cycle in which said data input is designated, the synchronous semiconductor memory device further comprises an address buffer circuit provided between said address terminal and said address retaining circuit for taking in said address signal in response to each activation edge of said clock signal, wherein said address retaining circuit includes an N number of address register circuits connected in series between said adress buffer circuit and said adress select circuit, each of said N number of address register circuits operating when said write control signal is activated at an activation edge of said clock signal at a clock cycle, and said data terminal performs said data input/output N clock cycles later than the input of said address signal.

\* \* \* \* \*